United States Patent [19]
Carlson et al.

[11] Patent Number: 4,674,125
[45] Date of Patent: Jun. 16, 1987

[54] REAL-TIME HIERARCHAL PYRAMID SIGNAL PROCESSING APPARATUS

[75] Inventors: Curtis R. Carlson, Princeton Township, Mercer County; James H. Arbeiter, Hopewell Township, Mercer County; Roger F. Bessler, West Windsor Township, Mercer County, all of N.J.

[73] Assignee: RCA Corporation, Princeton, N.J.

[21] Appl. No.: 596,817

[22] Filed: Apr. 4, 1984

[30] Foreign Application Priority Data

Jun. 27, 1983 [GB] United Kingdom ................. 8317406
Jun. 27, 1983 [GB] United Kingdom ................. 8317407

[51] Int. Cl.$^4$ ............................................. G06K 9/54
[52] U.S. Cl. .................................... 382/49; 382/17; 382/41; 382/43; 364/723; 364/724; 364/725; 364/728
[58] Field of Search ....................... 382/17, 41, 43, 49; 358/133, 160, 167, 166, 903; 364/723, 724, 725, 728

[56] References Cited

U.S. PATENT DOCUMENTS

| | | | |
|---|---|---|---|
| 3,731,188 | 5/1973 | Smith | 358/167 |
| 4,442,454 | 4/1984 | Powell | 358/167 |
| 4,447,886 | 5/1984 | Meeker | 364/725 |
| 4,523,230 | 6/1985 | Carlson et al. | 358/167 |

OTHER PUBLICATIONS

"Segmentation and Estimation of Image Region Properties Through Cooperative Hierarchial Computation," by Peter J. Burt et al., *IEEE Transactions on Systems, Man, and Cybernetics*, vol. SMC-11, No. 12, 802-809, Dec. 1981.
"The Laplacian Pyramid as a Compact Image Code," by Peter J. Burt et al., *IEEE Transactions on Communications*, vol. COM-31, No. 4, 532-540, Apr. 1983.
"Fast Algorithms for Estimating Local Image Properties," by Peter J. Burt, *Computer Vision, Graphics, and Image Processing*, 21, 368-382, (1983).
"Tree and Pyramid Structures for Coding Hexagonally Sampled Binary Images," by Peter J. Burt, *Computer Graphics and Image Processing*, 14, 271-280, (1980).
"Pyramid-Based Extraction of Local Image Features With Applications to Motion and Texture Analysis," by Peter J. Burt, *SPIE*, vol. 360, 114-124.
"Fast Filter Transforms for Image Processing," by Peter J. Burt, *Computer Graphics and Image Processing*, 16, 20-51, (1981).
"A Multiresolution Spline with Applications to Image Mosaics," by Peter J. Burt et al., Image Processing Laboratory, Electrical, Computer, and Systems Engineering Department, Rensselaer Polytechnic Institute, Jun. 1983.
"The Pyramid as a Structure for Efficient Computation," by Peter J. Burt, Image Processing Laboratory, Electrical and Systems Engineering Department, Rensselaer Polytechnical Institute, Jul. 1982.
"Design of FIR Filters Using Windows," by A. V. Oppenheim and R. W. Schafer, *Digital Signal Processing*, Section 5.5, 239-251.
"A Digital Signal Processing Approach to Interpolation," by R. W. Schafer and L. R. Rabiner, *Proceedings of the IEEE*, vol. 61, No. 6, 692-702, Jun. 1973.

Primary Examiner—Leo H. Boudreau
Assistant Examiner—Jose L. Couso
Attorney, Agent, or Firm—Joseph S. Tripoli; George J. Seligsohn

[57] ABSTRACT

Pipe-line architecture is employed for analyzing in delayed real time the frequency spectrum of an information component (having one or more dimensions) of a given temporal signal having a highest frequency of interest of no greater than $f_0$, and/or for synthesizing in delayed real time such a temporal signal from the analyzed frequency spectrum thereof. Such pipe-line architecture is particularly suitable for image-processing the two-dimensional spatial frequencies of television images defined by a temporal video signal.

39 Claims, 16 Drawing Figures

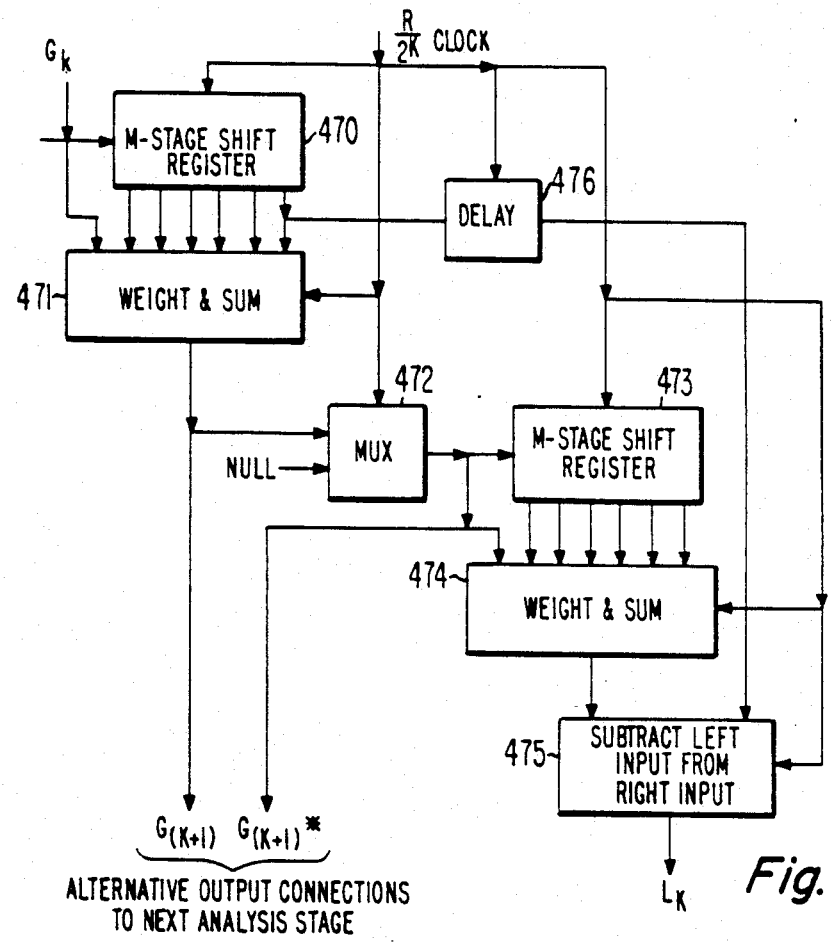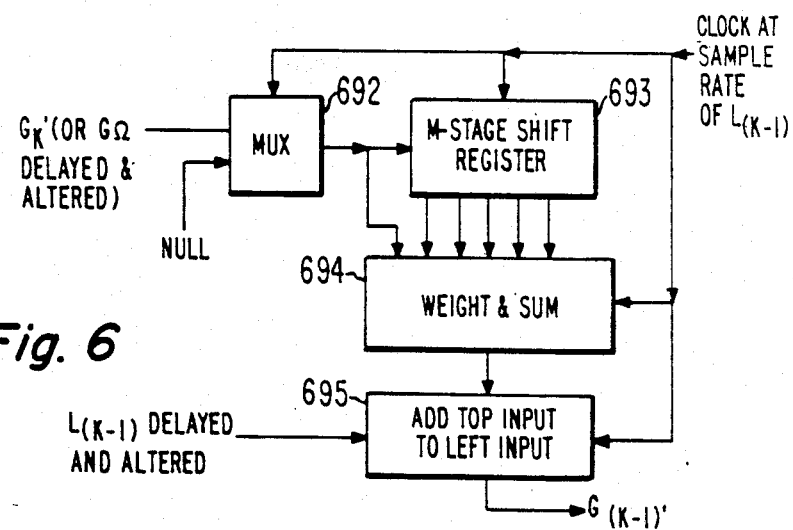

REAL-TIME HIERARCHAL PYRAMID SIGNAL PROCESSING APPARATUS

CROSS REFERENCE

Reference is made herein to an embodiment of an invention, Ser. No. 774,984, filed Sept. 11, 1985, by Charles H. Anderson, for "A Filter-Subtract-Decimate Hierarchal Pyramid Signal Analyzing Method and Processor."

BACKGROUND OF THE INVENTION

1. Field of the Invention

This invention relates to signal processing apparatus for analyzing and/or synthesizing signals. More particularly, the signal processing apparatus of the present invention employs pipe-line architecture for analyzing in delayed real time the frequency spectrum of an information component (having one or more dimensions) of a given temporal signal having a highest frequency of interest no greater than $f_0$, and/or for synthesizing in delayed real time such a temporal signal from the analyzed frequency spectrum thereof. Although not limited thereto, the present invention is particularly suitable for image-processing in delayed real time the two-dimensional spatial frequencies of television images defined by a temporal video signal.

2. Description of the Prior Art

Much work has been done in modeling the operation of the human visual system. It has been found that the human visual system appears to compute a primitive spatial-frequency decomposition of luminous images, by partitioning spatial frequency information into a number of contiguous, overlapping spatial-frequency bands. Each band is roughly an octave wide and the center frequency of each band differs from its neighbors by roughly a factor of two. Research suggests that there are approximately seven bands or "channels" that span the 0.5 to 60 cycle/degree spatial-frequency range of the human visual system. The importance of these findings is that spatial frequency information more than a factor of two away from other spatial frequency information will be independently processed by the human visual system.

It has been further found that the spatial-frequency processing that occurs in the human visual system is localized in space. Thus, the signals within each spatial-frequency channel are computed over small subregions of the image. These subregions overlap each other and are roughly two cycles wide at a particular frequency.

If a sine wave grating image is employed as a test pattern, it is found that the threshold contrast-sensitivity function for the sine wave grating image rolls-off rapidly as the spatial frequency of the sine wave grating image is increased. That is, high spatial frequencies require high contrast to be seen ($\simeq 20\%$ at 30 cycle/degree) but lower spatial frequencies require relatively low contrast to be seen ($\simeq 0.2\%$ at 3 cycle/degree).

It has been found that the ability of the human visual system to detect a change in the contrast of a sine wave grating image that is above threshold also is better at lower spatial frequencies than at higher spatial frequencies. Specifically, an average human subject, in order to correctly discriminate a changing contrast 75% of the time, requires roughly a 12% change in contrast for a 3 cycle/degree sine wave grating, but requires a 30% change in contrast for a 30 cycle/degree grating.

Dr. Peter J. Burt, who is aware of the above-discussed properties of the human visual system, has developed an algorithm (hereinafter referred to as the "Burt Pyramid"), that he implemented by computer in non-real time, to analyze the two-dimensional spatial frequencies of an image into a plurality of separate spatial frequency bands. Each spatial frequency band (other than the lowest spatial frequency band) is preferably an octave in width. Thus, if the highest spatial frequency of interest of the image is no greater than $f_0$, the highest frequency band will cover the octave from $f_0/2$ to $f_0$ (having a center frequency at $3f_0/4$); the next-to-highest frequency band will cover the octave from $f_0/4$ to $f_0/2$ (having a center frequency at $3f_0/8$), etc.

Reference is made to the following list of articles, authored or co-authored by Dr. Burt, which describe in detail various aspects of the Burt Pyramid:

"Segmentation and Estimation of Image Region Properties Through Cooperative Hierarchial Computation," by Peter J. Burt, et al., *IEEE Transactions on Systems, Man, and Cybernetics,* Vol. SMC-11, No. 12, 802–809, December 1981.

"The Laplacian Pyramid as a Compact Image Code," by Peter J. Burt, et al., *IEEE Transactions on Communications,* Vol. COM-31, No. 4, 532–540, April 1983.

"Fast Algorithms for Estimating Local Image Properties," by Peter J. Burt, *Computer Vision, Graphics, and Image Processing* 21, 368–382 (1983).

"Tree and Pyramid Structures for Coding Hexagonally Sampled Binary Images," by Peter J. Burt, *Computer Graphics and Image Processing* 14, 271–280 (1980).

"Pyramid-based Extraction of Local Image Features with Applications to Motion and Texture Analysis," by Peter J. Burt, *SPIE,* Vol. 360, 114–124.

"Fast Filter Transforms for Image Processing," by Peter J. Burt, *Computer Graphics and Image Processing* 16, 20–51 (1981).

"A Multiresolution Spline with Applications to Image Mosaics," by Peter J. Burt, et al., Image Processing Laboratory, Electrical, Computer, and Systems Engineering Department, Rensselaer polytechnic Institute, June 1983.

"The Pyramid as a Structure for Efficient Computation," by Peter J. Burt, Image Processing Laboratory, Electrical and Systems Engineering Department, Rensselaer Polytechnic Institute, July, 1982.

The Burt Pyramid algorithm uses particular sampling techniques for analyzing a relatively high resolution original image into a hierarchy of N (where N is a plural integer) separate component images (in which each component image is a Laplacian image comprised of a different octave of the spatial frequencies of the original image) plus a remnant Gaussian image (which is comprised of all the spatial frequencies of the original image below the lowest octave component Laplacian image). The term "pyramid" as used herein, relates to the successive reduction in the spatial frequency bandwidth and sample density of each of the hierarchy of component images in going from the highest octave component image to the lowest octave component image.

A first advantage of the Burt Pyramid algorithm is that it permits the original high-resolution image to be synthesized from the component images and the remnant image without the introduction of spurious spatial frequencies due to aliasing. A second advantage of the Burt Pyramid algorithm is that the spatial frequency bandwidth of one octave of each of the hierarchy of the component images matches the properties of the human visual system, discussed above. This makes it possible to selectively process or alter the spatial frequencies of individual ones of the hierarchy of component images in different independent ways (i.e., without the signal processing of any one component image significantly affecting any other component image), in order to enhance or produce some other desired effect in the synthesized image derived from the processed component images. An example of such a desired effect is the multiresolution spline technique described in detail in the article "A Multiresolution Spline with Applications to Image Mosiacs," listed above.

Until now, the Burt Pyramid algorithm has been implemented in non-real time by means of a general purpose digital computer. The level of each picture element (pixel) sample of an original image is represented by a multibit (e.g., 8 bit) number stored at an individual address location of a computer memory. For example, a relatively high-resolution two-dimensional original image comprised of $2^9$ (512) pixel samples in each of its two dimensions requires a large memory of $2^{18}$ (262,144) address locations for respectively storing each of the multibit numbers representing the levels of the respective pixel samples comprising the original image.

The original image stored in the memory can be processed by a digital computer in accordance with the Burt Pyramid algorithm. This processing involves the iterative performance of such steps as convolution of pixels samples with a predetermined kernel weighting function, sample decimation, sample expansion by interpolation, and sample subtraction. The size of the kernel function (in either one or more dimensions) is relatively small (in terms of the number of pixels) compared to the size in each dimension of the whole image. The subregion or window of image pixels (equal in size to the kernel function and symmetrically disposed, in turn, about each image pixel) is multiplied by the kernel weighting function and summed in a convolution computation.

The kernel weighting function is chosen to operate as a low-pass filter of the multi-dimensional spatial frequencies of the image being convoluted. The nominal "cut-off" (also known in the filter art as "corner" or "break") frequency of the low-pass filter characteristics provided in each dimension by the kernel function is chosen to be substantially one-half the highest frequency of interest in that dimension of the signal being convolved. However, this low-pass filter characteristic need not have a "brick wall" roll-off at a given cut-off frequency, but can have a relatively gradual roll-off, in which case a nominal cut-off frequency is defined as the frequency at which some preselected value (e.g., 3 db) of attenuation in the gradual roll-off takes place. Filters with more gentle roll-off characteristics can be used because the Burt Pyramid inherently compensates for the introduction of spurious frequencies, due to aliasing, caused by a gradual roll-off low-pass filter characteristic. The convolved image is decimated by effectively throwing away, in each of the respective dimensions of the image successively considered, every other convolved pixel, thereby reducing the number of pixels in the convolved image in each dimension thereof by one-half. Since an image is conventionally a two-dimensional image, a convolved-decimated image is comprised of only one-fourth the number of pixels contained in the image prior to such decimation. The reduced number of pixel samples of this convolved-decimated image (which is called a Gaussian image) are stored in a second memory.

Starting with the stored original image pixel samples, the aforesaid convolution-decimation procedure is iteratively performed N times (where N is a plural integer) thereby resulting in (N+1) images comprised of the original high-resolution image and a heirarchal pyramid of N reduced-resolution Gaussian additional images, wherein the number of pixel samples (sample density) in each dimension of each additional image is only one-half the number of pixel samples in each dimension of the immediately preceding image. If the original, high-resolution stored image is designated $G_0$, the hierarchy of N stored additional images can be respectively designated $G_1$ through $G_N$, with the successively reduced number of pixel samples of each of these N additional images being stored in a separate one of N memories. Thus, counting the stored original image, there are a total of N+1 memories.

In accordance with the non-real time implementation of the Burt Pyramid algorithm, the next computational procedure is to generate interpolated-value additional samples between each pair of stored $G_1$ pixel samples in each dimension thereof, thereby expanding the reduced sample density of the stored $G_1$ image back to the sample density of the original stored $G_0$ image. The digital value of each of the pixel samples of the expanded $G_1$ image is then subtracted from the stored digital value of the corresponding pixel sample of the original $G_0$ image to provide a difference image (known as a Laplacian image). This Laplacian image (designated $L_0$), which has the same sample density as the original $G_0$ image, is comprised of those spatial frequencies contained in the original image within the octave $f_0/2$ to $f_0$—plus, often, a small lower spatial frequency error-compensating component that corresponds to the loss of information caused respectively by the decimation step employed in deriving the reduced sample density of the $G_1$ image and in the introduction of interpolated value samples that occurs in expanding the sample density back to that of the original $G_0$ image. This Laplacian image $L_0$ then replaces the original image $G_0$ in storage in the first of the N+1 pyramid memories.

In a similar manner, by iterating this procedure, a heirarchy comprised of N−1 additional LaPlacian images $L_1$ through $L_{N-1}$ is derived, in turn, and written into a corresponding one of the respective additional N−1 memories in which the Gaussian images $G_1$ through $G_{N-1}$ are stored (thereby replacing in memory the Gaussian images $G_1$ through $G_{N-1}$). The Gaussian image $G_N$ (having the most reduced sample density) is not replaced in its corresponding memory by a Laplacian image, but remains stored in the memory as a Gaussian remnant comprised of the lowest spatial frequencies (i.e., those below the $L_{N-1}$ octave) contained in the original image.

The Burt Pyramid algorithm permits the original image to be restored, without aliasing, by an iterative computational procedure which involves successive steps of expanding the stored remnant image $G_N$ to the sampling density of the $L_{N-1}$ image and then adding it to the stored Laplacian image $L_{N-1}$ to derive a sum image. This sum image is expanded in a similar manner and added to the Laplacian image $L_{N-2}$, etc., until the original high-resolution image has been synthesized by the summation of all the Laplacian images and the remnant image. Furthermore, following the analysis of one or more original images into N Laplacian images and a Gaussian remnant, it is possible to introduce any particular desired image processing or altering step (such as splining) before synthesizing a complete high-resolution image therefrom.

SUMMARY OF THE INVENTION

The non-real time implementation of the Burt Pyramid algorithm by computer processing is effective in processing fixed image information. Thus, it is not applicable to the analysis of a stream of successively-occurring images which can be continually changing in time (e.g., successive video frames of a television picture). A real time implementation of the Burt Pyramid algorithm, such as provided by the present invention, is required to analyze such successively-occurring time-changing images.

More specifically, the present invention is directed to signal processing apparatus employing pipe-line architecture for analyzing in delayed real time the frequency spectrum of an information component of a given temporal signal, in which the highest frequency of interest of this frequency spectrum is no greater than $f_0$. Further, this information component of the given temporal signal corresponds with information having a given number of dimensions. The apparatus comprises a set of N ordinally arranged sampled-signal translation means (where N is a plural integer). Each one of the translation means includes first and second input terminals and first and second output terminals. The first input terminal of each one of the second to the Nth translation means of the set is coupled to the first output terminal of the immediately preceding one of the translation means of this set for forwarding a signal from each one of the translation means to the immediately following one of the translation means of the set. The processing apparatus further includes means for applying the given temporal signal to the first input terminal of the first translation means of the set and means for applying a separate sampling frequency clock to the second input terminal of each one of the translation means of the set. Each one of the translation means of the set derives a sample rate for respective signals derived at the second output terminal of that translation means equal to the sampling frequency of the clock applied thereto.

Further, each one of the translation means of the set exhibits a low-pass transfer function between its first input terminal and its first output terminal for the information component of the signal applied to its first input terminal. The low-pass transfer function of each translation means of the set has a nominal cutoff frequency that is a direct function of the sampling frequency of the clock applied to the second input of that one of the translation means of the set. Further, the clock applied to the second input terminal of the first translation means of the set has a sampling frequency that (1) is twice $f_0$ and (2) provides for said information component a nominal cutoff frequency for said low-pass transfer function of the first translation means of said set which is less than $f_0$. However, the clock applied to the second input terminal of each one of the second to Nth translation means of the set has a sampling frequency that (a) is less than the clock frequency applied to the second input terminal of the immediately preceding one of the translation means of the set, (b) is at least equal to twice the maximum frequency of the information component applied to its first input terminal, and (c) provides a nominal cutoff frequency for its low-pass transfer function which is less than that of its immediately preceding translation means of the set.

The signal derived at the second output terminal of each one of the translation means of the set corresponds to the difference between the information component applied to the first input terminal thereof and a direct function of the information component derived at the first output terminal thereof.

Although not limited thereto, the information component of the given temporal signal processed by the signal processing apparatus of the present invention may, by way of example, correspond to the two-dimensional spatial frequency components of each of successive frames of a television picture that has been serially scanned in each of two dimensions.

In general, the present invention is useful in analyzing the frequency spectrum of a signal derived from a source of spatial or non-spatial frequencies in one or more dimensions, regardless of the particular nature of the source. Thus, for instance, the present invention is useful in analyzing one, two, three or more dimensional complex signals derived from audio sources, radar sources, seismograph sources, robotic sources, etc., in addition to two-dimensional visual image sources, such as television pictures. Further, the present invention is also directed to signal processing apparatus employing pipe-line architecture and responsive to a set of analyzed signals for synthesizing in delayed real time such a complex signal.

BRIEF DESCRIPTION OF THE DRAWING

FIG. 4 is a block diagram of one of the analysis stages used in the iterative calculations of the spectral analysis process of FIG. 3, which analysis embodies an aspect of the invention;

FIG. 6 is a block diagram of one of the synthesis stages used in the iterative process of signal synthesis of FIG. 3 from spectral components;

DESCRIPTION OF THE PREFERRED EMBODIMENTS

Figure 1:
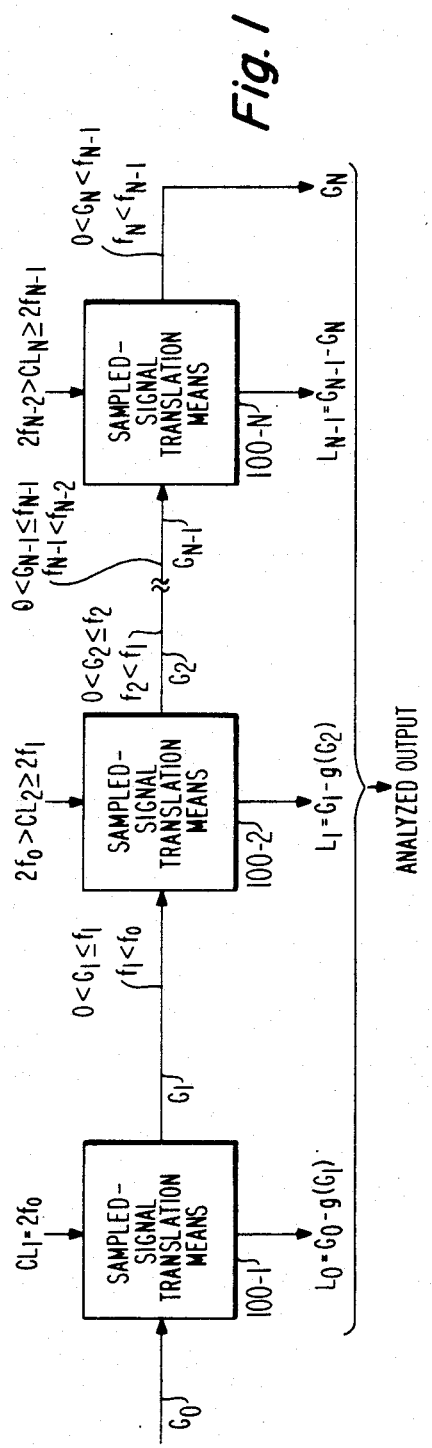
FIG. 1 is a functional block diagram that shows the present invention embodied in its most general and generic form.

Referring to FIG. 1, each of a set of N ordinally arranged sampled-signal translation means 100-1 to 100-N, inclusive, (where N is a plural integer) has two input terminals and two output terminals. A given temporal signal $G_0$ defining information is applied as an input to a first of the two input terminals of the first translation means 100-1 of the set. Temporal signal $G_0$ can be a continuous analog signal (such as an audio signal or a video signal) or, in the alternative, temporal signal $G_0$ can be a sampled analog signal, Further, in the latter case, each sample level can be represented directly by an amplitude level or may be represented indirectly by a digital number (i.e., by passing each sample amplitude level through an analog-to-digital converter, not shown in FIG. 1, before applying the temporal signal $G_0$ to the first input terminal of translation means 100-1). The frequency spectrum of $G_0$ includes a range extending between zero (that is D.C.) and the frequency $f_0$ (i.e., a range that includes all frequencies of interest which corresponds with information having a given number of dimensions). More specifically, $G_0$ may be a prefiltered signal containing no frequency greater than $f_0$. In this case, the clock frequency $2f_0$ of translation means 100-1 satisfies the Nyquist criterion for all the frequency components of $f_0$. However, in the alternative, $G_0$ may contain some frequency components higher than $f_0$, which are not of interest. In this latter case, the Nyquist criterion is not satisfied and some aliasing results. From a practical point of view, although undesirable, such aliasing (if not too large) can oftentimes be tolerated.

In FIG. 1, the first input terminal of each one of the other translation means 100-2 ... 100-N of the set is coupled to the first of the two output terminals of the immediately preceding one of the translation means of the set. Specifically, the first output terminal of signal translation means 100-1 is coupled to the first input terminal of translation means 100-2; the first output terminal of translation means 100-2 is coupled to the first input terminal of translation means 100-3, not shown; ... and the first output terminal of translation means of 100-(N−1), also not shown, is coupled to the first input terminal of translation means 100-N. Thus, the signal processing apparatus shown in FIG. 1 makes use of pipe-line architecture in coupling each of the respective translation means of the set to one another.

A separate sampling frequency clock is applied to the second of the two input terminals of each one of the set of translation means 100-1 ... 100-N. More specifically, translation means 100-1 has a sampling frequency clock $CL_1$ applied as a second input thereto; translation means 100-2 has a sampling frequency clock $CL_2$ applied as a second input thereto ... and translation means 100-N has a sampling frequency clock $CL_N$ applied as a second input thereto. The relative values of clocks $CL_1 \ldots CL_N$ with respect to one another are constrained in the manner indicated in FIG. 1. The significance of these constraints is discussed in more detail below.

Further, in FIG. 1, translation means 100-1 derives a second output signal $L_0$ at its second output terminal. In a similar manner, the other translation means 100-2 ... 100-N of the set derive respective second output signals $L_1 \ldots L_{N-1}$ at their respective second output terminals.

Each single one of translation means 100-1 ... 100-N of the set, regardless of its particular internal structure, can be viewed as a black box that exhibits a low-pass transfer function between its first input terminal and its first output terminal for the frequency spectrum of the information component of the input signal applied to its first input terminal. Further, this low-pass transfer function of each single one of the translation means 100-1, 100-2 ... 100-N of the set has a roll-off that has a nominal cutoff frequency that is a direct function of the sampling frequency of the clock applied to its second input terminal. As discussed above, in the case of the Burt Pyramid, the roll-off may be gradual, rather than being a "brick wall."

More specifically, translation means 100-1 has the input signal $G_0$, discussed above, applied to its first input terminal. The highest frequency of interest in the frequency spectrum of $G_0$ is no greater than $f_0$. Also, the sampling frequency clock $CL_1$, applied to the second input terminal of translation means 100-1, is equal to $2f_0$ (i.e., has a frequency that satisfies the Nyquist criterion for all of the frequencies of interest within the frequency spectrum of $G_0$). Under these conditions, the low-pass transfer function between first input terminal and the first output terminal of translation means 100-1 is such that only those frequencies within the frequency spectrum of $G_0$ which are no greater than $f_1$ (where $f_1$ is less than $f_0$) are passed to the first output terminal of translation means 100-1. Thereby, an output signal $G_1$ is derived at the first output terminal of translation means 100-1 that has a frequency spectrum (determined by the particular characteristics of the low-pass transfer function) that is comprised primarily of the lower portion of the frequency spectrum of $G_0$. This signal $G_1$ is then applied as an input to the first input terminal of translation means 100-2.

As indicated in FIG. 1, the sampling frequency clock $CL_2$ (applied to the second input terminal of translation means 100-2) is lower than $2f_0$ (the sampling frequency of clock $CL_1$) but is at least equal to $2f_1$ (twice the maximum frequency $f_1$ in the frequency spectrum of $G_1$). Therefore, the sampling frequency of clock $CL_2$ is still sufficiently high to satisfy the Nyquist criterion for the frequency spectrum of $G_1$ applied to the first input terminal of translation means 100-2, though it is not sufficiently high to satisfy the Nyquist criterion for the highest possible frequency of interest $f_0$ in the frequency spectrum of $G_0$ applied to the first input terminal of the immediately preceding translation means 100-1. This type of relationship (in which the sampling frequency of the clock applied to the second input terminal of the translation means of the set becomes lower as the ordinal position of that translation means of the set becomes higher) applies in general. More specifically, the clock applied to the second input terminal of each one of translation means 100-2 ... 100-N of the set has a sampling frequency that (a) is less than the clock applied to the second input terminal of the immediately preceding one of the translation means of the set, (b) is at least equal to twice the maximum frequency of the information component of the signal applied to its first input terminal, and (c) scales downward the nominal cutoff frequency for its low-pass transfer function to a value which is less than that of its immediately preceding translation means of the set. Thus, the maximum frequency $f_2$ of the signal $G_2$, appearing at the second output terminal of translation means 100-2, is less than $f_1$ ... and, finally, the maximum frequency $f_N$ in the frequency spectrum of the signal $G_N$ (appearing at the first output terminal of translation means 100-N) is lower than the frequency $f_{N-1}$ of the frequency spectrum of the signal $G_{N-1}$ (appearing at the first output terminal of the translation means (not shown) of the set which immediately precedes translation means 100-N and which is applied to the first input terminal of translation means 100-N).

Again, viewing each single one of translation means 100-1 ... 100-N as a black box, each of the respective output signals $L_0$ ... $L_{N-1}$, derived, respectively, at the second output terminal of each single one of translation means 100-1 ... 100-N of the set, corresponds to the difference between the information component of the signal applied to the first input terminal of that translation means and a direct function of the information component of the signal derived at the first output terminal of that translation means. Thus, as indicated in FIG. 1, $L_0$ is equal to (or at least corresponds to) the difference $G_0 - g(G_1)$, where $g(G_1)$ is either $G_1$ itself or a certain specified direct function of $G_1$. In a similar manner, $L_1$ is equal to (or at least corresponds to) $G_1 - g(G_2)$; ... $L_{N-1}$ is equal to (or at least corresponds to) $G_{N-1} - g(G_N)$.

The signal processing apparatus disclosed in FIG. 1 analyzes the original signal $G_0$ into a plurality of parallel outputs comprised of the Laplacian outputs $L_0, L_1$ ... $L_{N-1}$ (derived, respectively, at the second output terminal of each of the respective pipe-lined translation means 100-1 ... 100-N of the set) plus a remnant Gaussian output $G_N$ (derived at the first output terminal of the final translation means 100-N of the set).

In general, the only limitations on the relative values of the respective sampling clock frequencies $f_0$ ... $f_{N-1}$ are those indicated in FIG. 1. However, it is usually advantageous to specify values of the sampling clock frequencies applied to the second input terminal of each of the respective translation means 100-1 ... 100-N such that the respective ratios $CL_2/CL_1, CL_3/CL_2$ ... $CL_N/CL_{N-1}$ are equal to $\frac{1}{2}$ (or may be integral power of $\frac{1}{2}$ corresponding with the number of dimensions of the information component of the signal being analyzed). This results in the analyzed output of the frequency spectrum of the original signal $G_0$ being divided into the separate parallel frequency passbands of Laplacian component signals $L_0$ ... $L_{N-1}$, which (neglecting any sampling errors due to the loss of signal information caused by reduction in sampling density or due to the addition of spurious aliasing frequency components) are each one octave wide in bandwidth for each dimension of the information component and include only those frequencies present in the frequency spectrum of the original signal $G_0$ that fall within that particular octave. Those frequencies of the frequency spectrum of the original signal $G_0$ which fall below the lowest octave Laplacian component signal $L_{N-1}$ are then contained in the remnant Gaussian signal $G_N$ of the analyzed output.

In general, N is a plural integer having any given value of two or more. However, there are types of information in which a relatively small given value of N may be sufficient to analyze all frequencies of interest in each dimension of the frequency spectrum of the original signal $G_0$ with sufficiently high resolution. By way of example, in the case of visual images, it is often found that a value of seven for N is sufficient, so that, in this case, the frequencies in each dimension of remnant signal $G_N$ are less than 1/128th ($\frac{1}{2}^7$) of the highest frequency of interest $f_0$ of the frequency spectrum $G_0$ of the original signal.

Figure 1A:
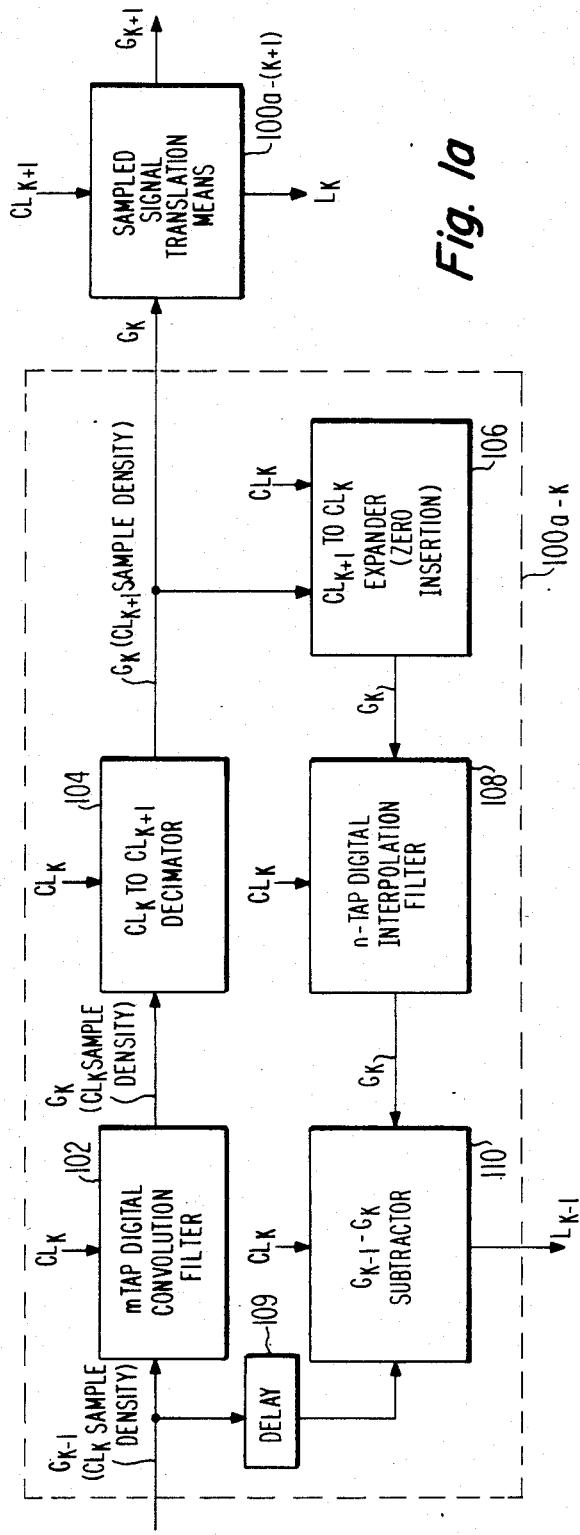
FIG. 1a shows a digital embodiment of a first species of any single one of the set of sampled-signal translation means of FIG. 1.

Referring to FIG. 1a, there is shown, in generalized form, a digital embodiment of a first species of the respective sampled signal translation means 100-1 ... 100-N of the pipe-lined set shown in FIG. 1. In FIG. 1a, the first species embodiment of any single one of translation means 100-1 ... 100(N-1) of the set is designated 100a-K and the first species embodiment of the immediately following one of the translation means of the set is designated 100a-(K-1).

Translation means 100a-K is comprised of m-tap digital convolution filter 102 (where m is a plural integer of three or more—preferably odd), decimator 104, expander 106, n-tap digital interpolation filter 108 (where n is a plural integer of three or more—preferably odd), delay 109, and subtractor 110. Sampling frequency clock $CL_K$ (i.e., the clock shown in FIG. 1 as being applied to the second input terminal of each translation means of the set of translation means 100a-K) is applied as a control input to each of respective elements 102, 104, 106, 108, 109, and 110 thereof.

The signal $G_{K-1}$, coupled to the first input terminal of translation means 100a-K, is applied as an input to convolution filter 102 and after delay 109 as an input to subtractor 110. The sample densities indicated in FIG. 1a are the sample densities per dimension of the information signal. Specifically, signal $G_{K-1}$ has a sample density in each information signal dimension that is mapped in the temporal domain by sampling rate of clock $CL_K$ of translation means 100a-K. Thus, each and every one of the samples comprising $G_{K-1}$ will be operated on by filter 102. The purpose of convolution filter 102 is to reduce the maximum frequency of its output signal $G_K$ with respect to the maximum frequency of its input signal $G_{K-1}$ (as discussed above in connection with FIG. 1). However, as indicated in FIG. 1a, the sample density at the output of filter 102 is still $CL_K$ sample rate.

This output from filter 102 is applied as an input to decimator 104. Decimator 104 forwards to its output only certain ones (not all) of the successive samples in each dimension applied to its input from filter 104. Thus, the sample density in each dimension at the output of decimator 104 is reduced with respect to the sample density in that dimension at the input to decimator 104. More specifically, as indicated in FIG. 1a, the sample density $CL_{K+1}$ in each dimension at the output of decimator 104, is such that in the temporal domain it can be mapped at the reduced rate defined by the reduced sampling frequency clock $CL_{K+1}$ applied to the second input terminal of the immediately following translation means 100a-(K+1). Further, the reduced sample density samples in each dimension of the $G_K$ signal at the output of decimator 104 as mapped into the temporal domain occur in phase with the occurrence of the sampling frequency clock $CL_{K+1}$ applied to the second input terminal of the immediately following translation means 100a-(K+1). In FIG. 1a, the $G_K$ output signal from decimator 104 (which comprises the signal at the first output terminal of translation means 100a-K) is applied to the first input terminal of the immediately following translation means 100a-(K+1). Thus, the isochronous relationship between the reduced sampling density of the samples of $G_K$ at the first input terminal and the reduced sampling frequency clock $CL_{K+1}$ at the second input terminal of translation means $100a$-$(K+1)$ is similar to the isochronous relationship between the higher sampling density of the samples of $G_{K-1}$ at the first input terminal and the higher sampling frequency clock $CL_K$ at the second input terminal of translation means $100a$-K (described above).

Although not limited thereto, a preferred embodiment of decimator 104 is one that is effective, in each dimension of the signal information, in reducing the sample density at its input in that dimension by one-half. In this case, decimator 104 is effective in forwarding in each dimension every other sample at its input to its output. Thus, for one-dimensional signal information, the sample density $CL_{K+1}$ is $(\frac{1}{2})^1$ or one-half the sample density $CL_K$. For two-dimensional signal information, the sample density $CL_{K+1}$ in each of the two dimensions is one-half, providing a two-dimensional sample density of $(\frac{1}{2})^2$ or one-quarter.

Although the baseband frequency spectrum of $G_K$ is the same at the input to decimator 104 and at the output to decimator 104, the reduced sample density $G_K$ signal at the output from decimator 104 results in the loss of a certain amount of phase information that is present in the higher sample density $G_K$ signal applied to the input of decimator 104.

Besides being applied to the first input terminal of the immediately following translation means, the output from decimator 104 is also applied as an input to expander 106. Expander 106 serves to insert, as an additional sample, a null (a digital number representing a zero level) at each sample position of clock $CL_K$ at which a sample from the output of decimator 104 is absent. In this manner, the sample density at the output of expander 106 is restored to the sample density at the input to decimator 104. In the preferred case in which the sample density in each dimension is reduced by one-half, expander 106 inserts in each dimension a null between each pair of adjacent samples in that dimension at the output of decimator 104.

While expander 106 increases the sample density of its output with respect to its input, it in no way changes the $G_K$ signal information at the output thereof with respect to the input thereto. However, the introduction of nulls has the effect of adding images or repeats of baseband $G_K$ signal information that appears as sideband frequency spectra CL harmonics.

The $G_K$ signal at the output from expander 106 is then passed through interpolation filter 108. Interpolation filter 108 is a low-pass filter that passes the baseband $G_K$ signal, but suppresses the sideband frequency spectra CL harmonics. Accordingly, filter 108 is effective in replacing each of the zero-valued null samples with interpolated-value samples, each of which has a value defined by the respective values of the information-bearing samples which surround it. The effect of these interpolated-valued samples is to define with higher resolution the envelope of the information-bearing samples. In this manner, the high-frequency component of the $G_K$ signal at the output of expander 106 which are above baseband are substantially removed by interpolation filter 108. However, interpolation filter 108 does not and cannot add any information to the $G_K$ interpolated signal at the output thereof that is not already present in the reduced sample density $G_K$ signal at the output of decimator 104. In other words, expander 106 serves to expand the reduced sample density in each dimension of the $G_K$ signal back to the sample density in each dimension of the $G_K$ signal at the output of convolution filter 102.

Subtractor 110 serves to subtract the $G_K$ signal appearing at the output on interpolation filter 108 from the $G_{K-1}$ signal coupled to the first input terminal of translation means $100a$-K and applied as an input to convolution filter 102 and through delay 109 to subtractor 110. Delay 109 provides a delay equal to the overall delay introduced by convolution filter 102, decimator 104, expander 106, and interpolation filter 108. Therefore, since both signals applied as inputs to subtractor 110 have, in each dimension thereof, the same sample density $CL_K$, and have undergone equal delays, subtractor 110 subtracts the level represented by the digital number of each sample of the $G_K$ signal input thereto from the level represented by the digital number of the corresponding sample of the $G_{K-1}$ input thereto. Thus, the output from subtractor 110 constitutes the Laplacian signal $L_{K-1}$ derived at the second output terminal of translation means $100a$-K.

Only those signal components of $G_{K-1}$ that are not also present in the $G_K$ signal applied to subtractor 110 will be present in the Laplacian $L_{K-1}$ signal at the output of subtractor 110. A first such component is comprised of the high-frequency portion of the frequency spectrum of the $G_{K-1}$ signal that is above the passband of convolution filter 102. Thus, by way of example, if translation means $100a$-K corresponds with translation means 100-1 of FIG. 1, first component of $L_{K-1}$ ($L_0$) includes those frequencies of the frequency spectrum of $G_{K-1}$ ($G_0$) within the passband $f_1$ to $f_0$. In addition to this component, however, the Laplacian output $L_{K-1}$ from subtractor 110 also includes an error-compensating second component comprised of frequencies within the passband of convolution filter 102 which correspond substantially with the phase information present in the higher-sample-density $G_K$ signal at the output of convolution filter 102 which phase information is lost in the decimation process (discussed above). Thus, the lost phase information in the reduced-sample density (decimated) $G_K$ signal forwarded to the first input terminal of the immediately following translation means $100a$-$(K+1)$ is substantially retained in the Laplacian signal $L_{K-1}$ derived at the second output terminal of translation means $100a$-K.

Each and every one of translation means 100-1 ... 100-N can have the configuration of translation means $100a$-K of FIG. $1a$. In this case, remnant signal $G_N$ of the analyzed output, derived at the first output terminal of the last translation means 100-N of the set will have a sample density in each dimension thereof that is less (preferably one-half) the sample density in each dimension of the $G_{N-1}$ signal applied to the first input thereof. However, since, by definition, no translation means of the set succeeds translation means 100-N, it is not essential for most applications (an exception is compressed data transmission applications) that the sample density of the remnant signal $G_N$ be smaller than the sample density of $G_{N-1}$ signal applied to the first input terminal of translation means 100-N. Therefore, in this case, rather than being comprised of all the structure of translation means $100a$-K, the final translation means 100-N of the set can be alternatively comprised of structure configured in the manner shown in FIG. $1c$ (although each and every one of the other translation means 100-1 ... 100(N−1) of the first-species set is still configured in the manner of translation means 100a-K). In FIG. 1c, the $G_N$ signal output of convolution filter 102 (having the same sample density in each dimension thereof as the $G_{N-1}$ signal applied to the input of convolution filter 102) is not passed through a decimator, but is forwarded directly as the remnant $G_N$ signal output from the last translation means 100a-N of the first-species set. Since, in this case, there has been no decimation, there is no need for expansion and interpolation. Therefore, the $G_N$ signal at the output of convolution filter 102 is applied directly as the $G_N$ input to subtractor 110. In other words, the configuration of translation means 100a-N in FIG. 1c differs from that of translation means 100a-K in FIG. 1a by dispensing with decimator 104, expander 106, and interpolation filter 108. In this case, delay 109 provides a delay equal only to that introduced by convolution filter 102.

The first species shown in FIG. 1a (or, in the alternative, in FIGS. 1a and 1c) provides a real time implementation of the Burt Pyramid algorithm. Of course, in its most useful form, each of the Laplacian components of the analyzed output derived by the Burt Pyramid algorithm is one octave in bandwidth in each dimension thereof. This most useful form of the Burt Pyramid algorithm is achieved in the real-time implementation of FIG. 1a by making the sampling frequency clock $CL_{K+1}$ in each dimension one-half of the sampling frequency clock $CL_K$ in that dimension.

Reference is now made to the aforesaid Anderson invention (RCA 80,364), which discloses another type of hierarchial pyramid that is an alternative to the Burt pyramid. This alternative pyramid is designated a "Filter-Subtract-Decimate" (FSD) pyramid. While the FSD pyramid does not possess certain of the desired properties of the Burt pyramid, the FSD does possess certain other desirable properties not possessed by the Burt pyramid. For instance, a desirable property of the Burt pyramid, not possessed by the FSD pyramid, is that spurious aliasing frequencies present in each of the respective Laplacian and remnant components of the analyzed output are inherently compensated for in the synthesis of the reconstituted original signal. On the other hand, in certain applications, the FSD requires less hardware and is thus less expensive to implement.

The FSD pyramid, which forms the subject matter of the aforesaid Anderson invention is not, per se, part of the present invention. However, signal processing apparatus of the present invention employing pipe-line architecture, which provides a real time implementation of the FSD pyramid, comprises a second species of the structural configuration of the respective ones of the set of sample signal translation means 100-a . . . 100-N that are shown in FIG. 1.

Figure 1B:
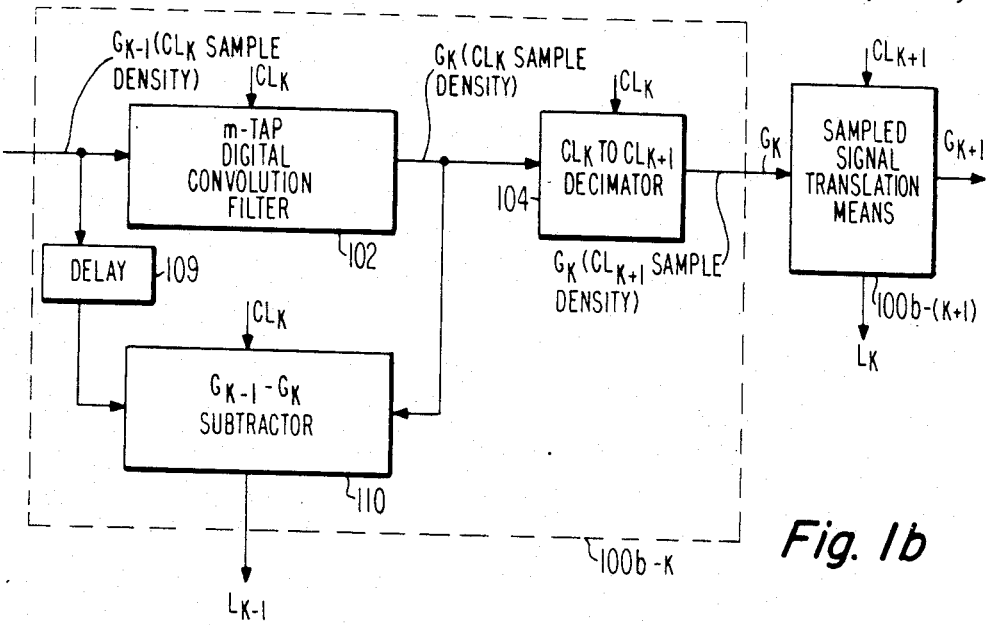
FIG. 1b shows a digital embodiment of a second species of any single one of the set of sampled-signal translation means of FIG. 1.
Figure 1C:
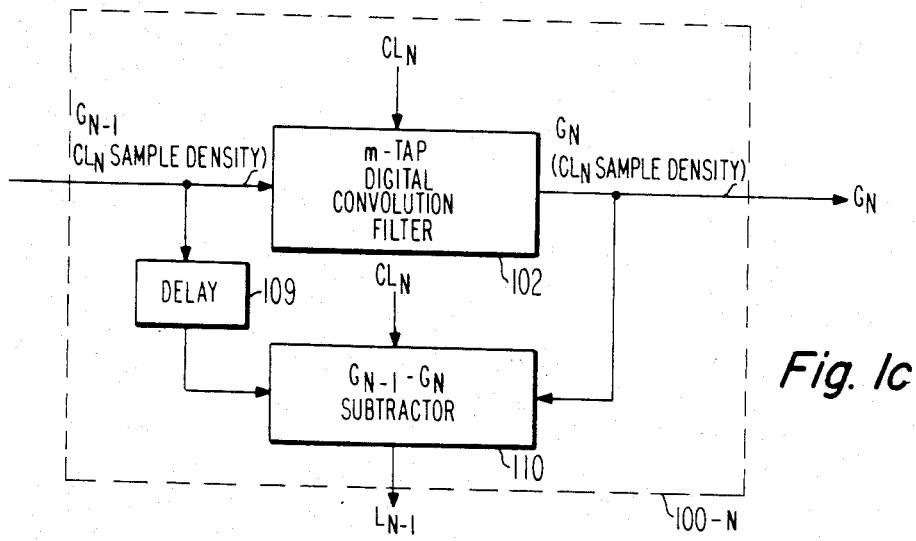
FIG. 1c shows an alternative digital embodiment of the final one of the set of sampled-signal translation means of either the first or the second species of FIG. 1.

Translation means 110b-K of FIG. 1b shows a digital embodiment of the aforesaid second species of each single one of translation means 100-1 . . . 100(N−1) of the set shown in FIG. 1. Further, translation means 100b-(K+1) in FIG. 1b represents that one of translation means 100-1 . . . 100-N of the set which immediately follows translation means 100b-K. As indicated in FIG. 1b, translation means 100b-K is comprised of only m-tap digital convolution filter 102, decimator 104, delay 109, and subtractor 110. The structural configuration of second-species translation means 100b-K shown in FIG. 1b, is similar to the structural configuration of the first-species translation means 100a-K (FIG. 1a) to the extent that the $G_{K-1}$ signal (having a $CL_K$ sample density) is applied as an input to filter 102 and through delay 109 as an input to subtractor 110, and that the output signal $G_K$ (also having a $CL_K$ sample density) is passed through decimator 104 in order to reduce in each dimension the sample density of the $G_K$ signal to $CK_{K+1}$ before applying the reduced sample-density $G_K$ signal to the first input terminal of the immediately following translation means 100b(K+1). The second-species translation mens 100b-K differs from the first-species translation means 100a-K by directly applying to the $G_K$ input of subtractor 110 the $CL_K$ sample density (in each dimension) $G_K$ signal that is applied from the output of filter 102 to the input of decimator 104. More specifically, this differs from the first-species translation means 100a-K, which employs the reduced $CL_{K+1}$ sample density (in each dimension) $G_K$ signal at the output of decimator 104. Thus, the first species requires expander 106 and interpolation filter 108 to restore the $G_K$ signal to its $CL_K$ sample density (in each dimension) before it is applied to the $G_K$ input of subtractor 110. Because the $G_K$ input to subtractor 110 of the second-species translation means 100b-K is not derived from a decimated sample density source, there is no need for expander 106 and interpolation filter 108 in the configuration of translation means 100b-K. Thus, in FIG. 1b, delay 109 provides a delay equal only to that introduced by convolution filter 102. Further, the $L_{K-1}$ output from subtractor 110 is comprised of only those relatively high frequency components of the frequency spectrum of the $G_{K-1}$ signal that are not also present in the $G_K$ signal at the output of convolution filter 102.

In accordance with the second species, the final translation means 100-N of the set may also have the structural configuration of translation means 100b-K, or, in the alternative, it can have the structural configuration of FIG. 1c.

The respective embodiments of the first and second species shown in FIGS. 1a and 1b are digital embodiments. In such digital embodiments, an analog-to-digital converter is employed initially to convert an analog signal into digital level samples, the level of each sample normally being represented by a multibit binary number. However, it not essential that either the first or second species of the present invention be embodied in digital form. Sampled-signal translation means employing charge-coupled devices (CCD) are well known in the art. For instance, CCD transversal filters, such as split-gate filters, can be designed as convolution filters and as interpolation filters. CCD signals are comprised of a series of discrete samples. However, each sample has an analog amplitude level. Thus, the present invention can be practiced either in digital form or analog form.

Figure 2:
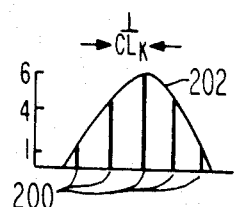
FIG. 2 shows an illustrative example of kernel weighting function that can be employed in implementing the present invention.

The filtering characteristics of a tapped filter depend on such factors as the number of taps, the effective time delay between taps, and the specified magnitude levels and polarity of respective weighting factors individually associated with each of the taps. For illustrative purpose, convolution filter 102 is assumed to be a one-dimensional five-tap filter. FIG. 2 represents an example of the specified magnitude levels of weighting factors all having the same polarity (positive in FIG. 2) that are respectively associated with the five individual taps. It also represents the effective time delay between each pair of adjacent taps. More specifically, as indicated in FIG. 2, the effective time delay between each pair of adjacent taps is $1/CL_K$, the sampling period defined by the sampling frequency clock $CL_K$ individually applied to convolution filter 102 of each one of the translation means 100-1 . . . 100-N of the first or of the second species (shown in FIGS. 1a, 1b and 1c). Thus, the absolute value of the time delay $CL_K$ of the convolution filter 102 of each translation means 100-2 . . . 100-N is longer than that of the immediately preceding translation means of the set.

In FIG. 2, the weighting factors associated with the five taps all have positive polarities and have specified magnitude levels that are symmetrically distributed with respect to the third tap. More specifically, in the illustrative example shown in FIG. 2a, the weighting factors associated with the third tap have the specified value of six, the respective weighting factors associated with each of the second and fourth taps have the same specified lower value of four, and the weighting factors associated with each of the first and fifth taps have the same still lower specified value of one. The envelope 202 of weighting factors 200 defines the kernel function (and hence the shape of the filter characteristics in the frequency domain) of convolution filter 102 of each of the translation means 100-1 . . . 100-N of the set. Specifically, because all of samples 200 (1) have the same polarity (positive in FIG. 2a), (2) are symmetrically disposed about the central (third) sample, and (3) the sample level becomes smaller the further away that sample is removed from the central sample, convolution filter 102 exhibits a low-pass filter characteristic in each of the respective translation means 100-1 . . . 100-N of the set. While in FIG. 2 all of the weighting factors have the same polarity (positive), this is not essential in a low-pass filter. Some of the weighting factors can have opposite (negative) polarity, so long as the algebraic sum of the weighting factors is other than zero. The kernel function waveform (such as that of envelope 202 of FIG. 2 for example) can be identical for all of convolution filters 102 of the respective translation means of the set, so that the relative low-pass frequency characteristics (the shape of the filter characteristics in the frequency domain) are the same for all of the filters 102 (although this is not essential). However, the absolute value of the low-pass nominal cutoff frequency of the filter for each individual one of the translation means has a scaling that depends on the sampling frequency period $1/CL_K$ for that filter. By appropriately selecting the levels of weighting factors 200 (which need not have the particular values 1, 4 and 6 shown in FIG. 2a), a low-pass nominal cutoff frequency can be achieved for signal $G_K$ at the output of convolution filter 102 (having in each dimension a sample density $CL_K$) which is substantially one-half of the maximum frequency (or, in the case of $G_0$, the highest possible frequency of interest $f_0$) of the $G_{K-1}$ signal input to convolution filter 102. In this case, decimator 104 reduces in each dimension the one-dimensional sample density of the $G_K$ signal to $CL_K/2$ by throwing away every other sample in that dimension. However, the $G_K$ signal (which is defined by the sample envelope 202) remains essentially the same at the input and output of decimator 104 (although there is some loss of phase information because of the lower sample density at the output from decimator 104).

As mentioned earlier, the FSD pyramid is not part of the present invention, but forms the subject matter of the aforesaid related Anderson invention (RCA 80,364). Therefore, although the real-time implementation of the FSD pyramid, per se, forms the second species (shown in FIG. 1b) of the FIG. 1 genus, it will not be discussed further herein. However, certain preferred embodiments of the real-time implementation of the Burt Pyramid, which forms the first species (shown in FIG. 1a) of the FIG. 1 genus, will now be described.

Figure 3:
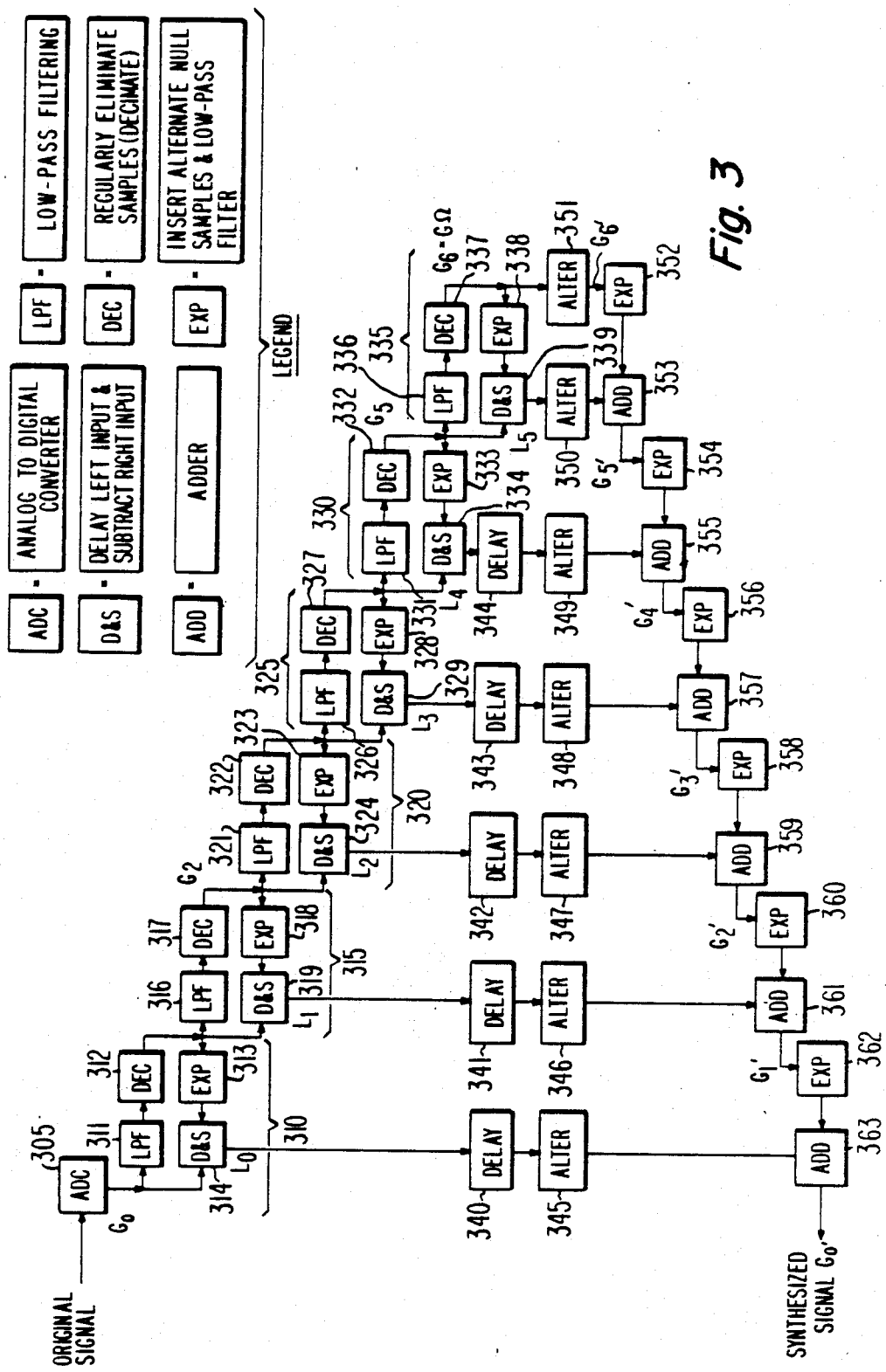
FIG. 3 is a block diagram of a one-dimensional system of spectrum analyzer, spectrum alteration circuitry, and signal synthesizer embodying aspects of the invention and includes a legend identifying certain of the blocks therein.

Reference is made to FIG. 3, which shows a system block diagram of a spectrum analyzer, spectrum alteration circuitry, and signal synthesizer operating on an electrical signal that represents one-dimensional information (such as any type of time-varying information signal, for instance).

FIG. 3 shows the original electric signal to be spectrum-analyzed being applied in analog form to an analog-to-digital converter 305 for digitization. The sampled digital response from ADC 305 is denominated $G_0$. The higher frequency response to $G_0$, a high-pass spectrum $L_0$, is extracted in a zero-order analysis stage 310 to leave $G_1$, a low-pass-filtered response to $G_0$. The higher frequency portion of $G_1$, a band-pass spectrum $L_1$, is extracted in a first-order analysis stage 315 to leave $G_2$, a low-pass-filtered response to $G_1$. The higher frequency portion of $G_2$, a band-pass spectrum $L_2$ below band-pass spectrum $L_1$, is extracted in a second-order analysis stage 320 to leave $G_3$, a low-pass-filtered response to $G_2$. The higher frequency portion of $G_3$, a band-pass spectrum $L_3$ below band-pass spectra $L_1$ and $L_2$, is extracted in a third-order analysis stage 325 to leave $G_4$, a low-pass-filtered response to $G_3$. The higher frequency portion of $G_4$, a band-pass spectrum $L_4$ below band-pass spectrum $L_3$, is extracted in a fourth-order analysis stage 330 to leave $G_5$, a low-pass-filtered response to $G_4$. The higher frequency portion of $G_5$, a band-pass spectrum below the other band-pass spectra, is extracted in a fifth-order analysis stage 335 to leave $G_6$, a remnant low-pass filtered response to $G_5$. The response $G_6$ is in effect a six-time low-pass filtered response to the original signal $G_0$.

The analysis stages 310, 315, 320, 325, 330 and 335 include initial low-pass filter stages 311, 316, 321, 326, 331 and 336, respectively, with successively narrower pass-bands. The low pass responses of these filters 311, 316, 321, 326, 331, 336 are sufficiently narrower than their input signals that they may be resampled at reduced rate before being forwarded to the next analysis stage. The reduction of samples is done by selection on a regular basis—i.e. by decimation—in decimation circuits 312, 317, 322, 327, 332, 337 following filters 311, 316, 321, 326, 331, 336 respectively. In spectrum analysis by octaves, which is particularly useful, alternate samples are eliminated by the decimation process.

The higher frequency portions of the input signal applied to each analysis stage is extracted by taking the low frequency portions of its input signal away from its input signal. The decimated lower frequency portion of the input signal has the problems of undesirably being in a sampling matrix with less resolution than the input signal and undesirably being delayed respective to the input signal. The first of these problems is resolved in expansion circuits 313, 318, 323, 328, 333, 338 by introducing nulls into the missing sample points in the low-pass-filter-response sample matrix, then eliminating by low-pass filtering the spurious harmonic spectra concomitantly introduced. The second of these problems is resolved by delaying the input signals of the analysis stages prior to subtracting from them the expanded low-pass filter responses provided by expansion circuits 313, 318, 323, 328, 333, 338.

The delay and subtraction processes are carried forward in circuits 314, 319, 324, 329, 334, 339 respectively in analysis stages 310, 315, 320, 325, 330, 335. (In certain instances, as will be described, elements may advantageously be shared between the initial low-pass filter and the delay and subtraction circuitry of each analysis stage.)

The spectral analysis just described is pipe-line in nature; and there is progressively longer time skew of $L_1$ samples, $L_2$ samples, $L_3$ samples, $L_4$ samples and $L_5$ samples respective to $L_0$ samples. The term "time skew," as used herein, refers to the differential time delays of predetermined known amounts that occur among the corresponding samples of informationally-related parallel signals—such as among the corresponding samples of the analyzed output signals $L_0$, $L_1$, $L_2$, $L_3$, $L_4$, $L_5$, and $G_6$ of the spectrum analyzer shown in FIG. 3. The signal synthesis from spectra procedures to be described require opposite time skew of the respective sets of samples. This can be provided by delay lines 340, 341, 342, 343 and 344 (typically comprising shift registers or other type of memory performing the equivalent function—e.g. a read-then-write serial memory) for $L_0$, $L_1$, $L_2$, $L_3$ and $L_4$ samples respectively before their alteration in circuits 345, 346, 347, 348 and 349, respectively, as shown in FIG. 3. Alternatively, the spectra may be altered and the altered spectrum sample subsequently delayed. Or delay can be partitioned before and after alteration in various ways—for example, to allow spectrum alterations to be made parallel in time. Conceivably, differential delays within the alteration circuits 345, 346, 347, 348 and 349 themselves may be used as portions of the overall different delay requirements in some circumstances.

The $L_5$ and $L_6$ spectra are altered in alteration circuits 350 and 351. In some signal processing applications certain of the alteration circuits 345-351 may not be required and will be replaced by respective direct connections. The spectral analysis procedures thus far described may be extended, with additional analysis stages being used, or truncated, with fewer analysis stages being used. The remnant low-pass spectrum, $G_\Omega$, at the end of spectral analysis will not be $G_6$ in such cases.

In synthesis of signal by recombining the spectrum analysis components, possibly altered, the decimation of sampling matrix from analysis stage to analysis stage must be undone, so the spectrum samples can be summed using adders 353, 355, 357, 359, 361, 363. This is in addition to correcting for time skew in delay circuits 340-344. The decimation is undone using expansion circuits 352, 354, 356, 358, 360 and 362 which are essentially like expansion circuits 338, 333, 328, 323, 318 and 313 respectively. Indeed, by multiplexing, a single circuit can perform double office. The remnant low-pass spectrum, $G_\Omega$, is skewed ahead in time respective to the adjacent band-pass spectrum, $L_{\Omega-1}$ such that its expansion aligns its sample in time with those of $L_{(\Omega-1)}$. In FIG. 3, $G_\Omega$ is $G_6$ which is altered (new $G_6'$) and expanded in expansion circuit 52 then added in adder 353 to an altered $L_{\Omega-1}$ ($L_5$ in FIG. 3) resulting in a synthesized new $G_{\Omega-1'}$ (new $G_5'$). Adder 353 output is expanded in expansion circuit 354 and added in adder 355 to delayed and altered $L_4$ to synthesize new $G_4'$. Adder 355 output is expanded in expansion circuit 354 and added in adder 357 to delayed and altered $L_3$ to synthesize new $G_3'$. Adder 357 output is expanded in expansion circuit 358 and added in adder 359 to delayed and altered $L_2$ to synthesize new $G_2'$. Adder 359 output is expanded in expansion circuit 60 and added in adder 361 to delayed and altered $L_2$ to synthesize new $G_1'$. Finally, adder 361 output is expanded in expansion circuit 362 and added in adder 363 to synthesize new $G_0'$. New $G_0'$, $G_1'$, $G_2'$, $G_3'$, $G_4'$, $G_5'$ and $G_6'$ are indicated by primes in FIG. 3 signal synthesis circuitry. New $G_0'$ may be converted to analog form by a digital-to-analog converter (not shown), if desired.

The expansions in circuits 352, 354, 356, 358, 360, 362 provide above-band rejection in each step of the synthesis process. Where the band-pass spectra are no wider than an octave, this provides suppression of any harmonics generated by alteration circuits 345-351 which might otherwise impair signal synthesis by introducing spurious "alias" frequencies.

FIG. 4 shows more explicitly the construction of a spectrum analysis stage for one-dimensional information, such as 310, 315, 320, 325, 330 or 335 used for spectrum analysis by octaves. The stage is the $K^{th}$-order spectrum analysis stage, K being zero or a positive integer. In the case of the zero-order spectrum analysis stage, the clock frequency for the stage will have a rate R for sampling the original input signal, $G_0$, the spectrum of which is to be analyzed. In the case of K being a positive integer the clock frequency is reduced by $2^K$.

The input signal, $G_K$, to the FIG. 4 spectrum analysis stage is applied as input to a shift register 470 having M stages and being clocked with $R/2^K$ clock frequency. The (M+1) samples with progressively longer delay provided by shift register 470 input and outputs from each of its output functions as the multiple-tap delay line of a low-pass delay line filter. The samples are weighted and summed in circuit 471 to provide samples of a linear-phase low-pass filter response, $G_{(K+1)}$. In all analysis stages save the initial one, in which stages K exceeds zero, the halved clock rate (as compared to previous stage clocking rate) used in the initial shift register 70 and the adders in weight-and-sum circuit 471 decimates $G_{(K+1)}$ relaive to $G_K$. The response $G_{(K+1)}$ is applied as one input signal of a multiplexer 472 providing alternate selection between its $G_{K+1}$ input signal and a null input, alternation being at $R/2^k$ rate, to generate a signal $G_{(K+1)*}$.

The signal $G_{(K+1)*}$ has a baseband frequency spectrum of twice $G_{(K+1)}$ spectrum admixed with a first-double-side-band, suppressed-carrier, harmonic spectrum of peak amplitude $G_{(K+1)}$. It is noted in passing that the succeeding spectrum analysis stage could use properly timed $G_{(K+1)*}$, rather than $G_{(K+1)}$, as input. The $G_{(K+1)*}$ signal is applied as input signal to another shift register 473 having a plural number of stages (which may be equal to or different from M) and being clocked at $R/2^K$ rate. The (M+1) samples provided by shift register 473 input signal and output signals from each of its stages are supplied to another weight-and-sum circuit 474 like circuit 471. Circuit 474 suppresses first harmonic spectrum of $G_{(K+1)*}$ and supplies an expanded version of $G_{(K+1)}$ in a sample matrix with as many samples as the sample matrix of $G_K$.

In an adder circuit 475 this expanded version of $G_{K+1}$ is subtracted from $G_K$, after $G_K$ has been delayed in shift register 470 and in a delay circuit 476. The M cycle delay of $G_K$ in shift register 470 compensates for the M/2 cycle delay of the center sample to weight-and-sum circuit 471 respective to $G_K$ input to the FIG. 4 spectrum analysis stage, and for the similar M/2 cycle delay between $G_{(K+1)*}$ and the center sample to weight-and-sum circuit 474. Delay 476 introduces delay to compensate for the delays in performing addition in weight-and-sum circuits 471 and 474, and delay 476 can be simply provided for by an extension of shift register 470 by the requisite number of further stages. The output signal, $L_K$, from adder circuit 475 is one of the spectrum analysis components sought for, having its lower frequency limit set by the low-pass filtering done in the $K^{th}$ spectrum analysis stage shown in FIG. 4, and having its upper frequency limit set by the low-pass filtering of the preceding spectrum analysis stage, if any.

Figure 5:
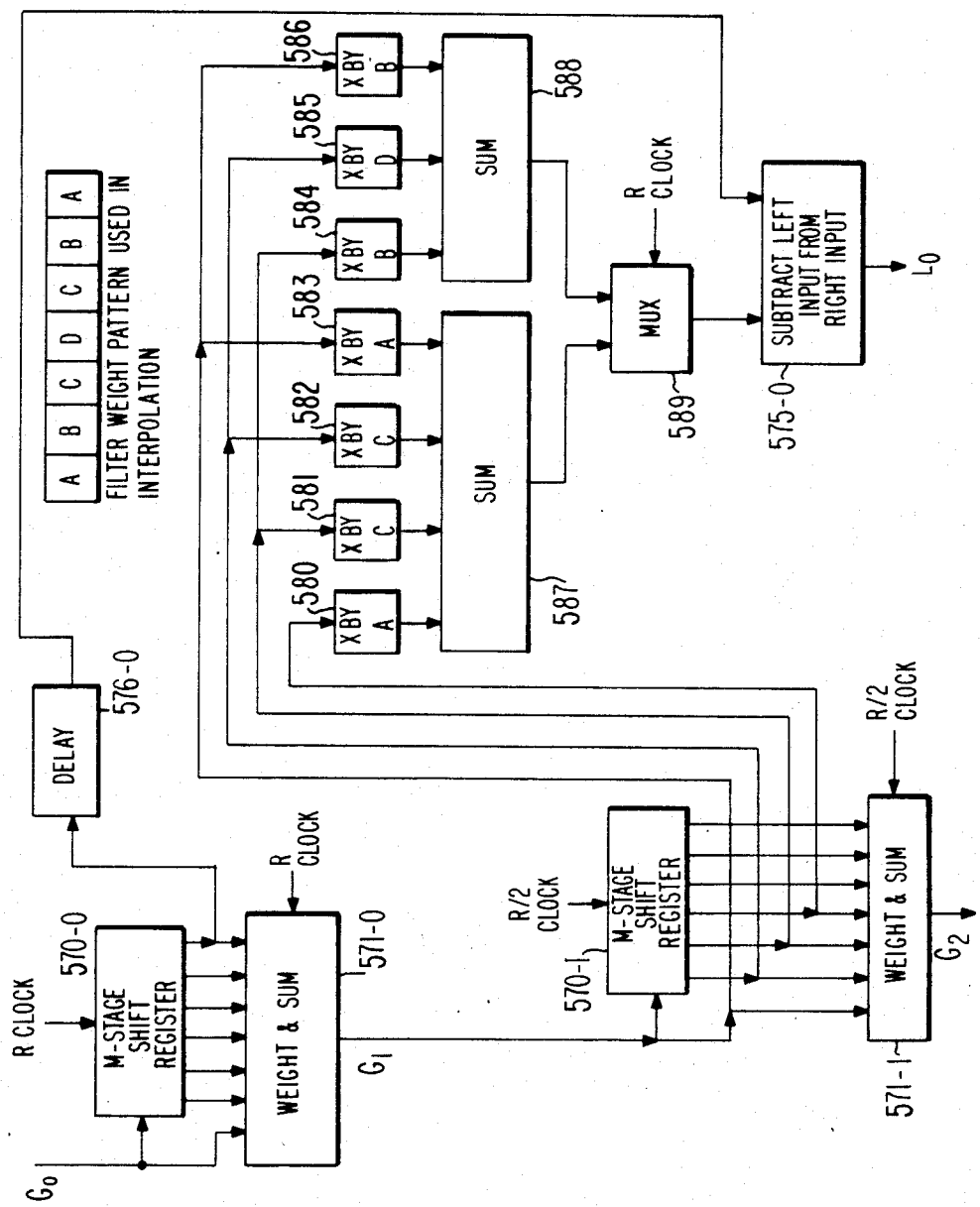
FIG. 5 is a block diagram of a modification that can be made to a successive pair of FIG. 4 analysis stages in another embodiment of the invention.

FIG. 5 shows a way to reduce the number of shift register stages used in a spectrum analyzer constructed in accordance with the invention. The samples to define $G_{(K+1)}*$, which are to be weighted and summed to perform the low-pass filtering associated with interpolation from $G_{(K+1)}$, are obtained from the tapped delay line structure used to support the initial low-pass filtering of $G_{(K+1)}$ in the succeeding spectrum analysis stage, rather than using shift register 473.

FIG. 5 shows, by way of example, how this is done as between the zero-order analysis stage used to generate $L_0$ and the succeeding analysis stage. The elements 570-0, 571-0, 575-0 and 576-0 are those elements in the zero-order spectrum analysis stage corresponding to elements 470, 471, 475 and 476 of the $K^{th}$ order spectrum analysis stage of FIG. 4. Elements 570-1 and 571-1 of the first-order spectrum analysis stage are analogous to elements 570-0 and 571-0 of the zero-order spectrum analysis stage except for being clocked at halved rate. The four samples extracted from the input and first three outputs of shift register 570-1 are supplied in parallel at R/2 clock rate. They will be interleaved with nulls, and the results will be weighted in two phasings by the seven-filter-weight pattern ABCDCBA to generate the pair of successive samples to be subtracted at R clock rate from delayed $G_0$ in subtractor 575-0.

The earlier sample of each pair of successive samples to be subtracted from delayed $G_0$ is obtained by multiplying the input of shift register 570-1 and its first three outputs by filter weights A, C, C and A in weighting circuits 580, 581, 582 and 583, then summing the weighted samples in summation circuit 587. The interleaved nulls would fall at points to be weighted B, D, B for this positioning of $G_1$ vis-a-vis the filter weight pattern. The later sample of each pair of successive samples to be subtracted from delayed $G_0$ is obtained by multiplying the input of shift register 570-1 and its first two inputs by filter weights B, D and B in weighting circuits 584, 585 and 586, then summing the weighted samples in summation circuit 588. The interleaved nulls would fall at points to be weighted A, C, C, A for this positioning of G, vis-a-vis the filter weight pattern. A multiplexer 589 operated at R clock rate alternately selects between the samples at the outputs of summation circuits 587 and 588 to provide the flow of samples to be subtracted from delayed $G_0$ in subtractor 575-0.

FIG. 6 shows in greater detail one stage of the FIG. 3 signal synthesizer. Samples of $G_{K'}$ (or delayed and altered $G_\Omega$) are interleaved with nulls in a multiplexer 692, and the resultant expanded signal is applied as input to a shift register 693 having M (or some other plural number) stages and being clocked at expanded sample rate. The input of shift register 693 and outputs from each of its stages are supplied to weight-and-sum circuit 694. The $G_{K'}$ (or $G_\Omega$) spectrum as resampled at doubled rate, then shorn of harmonic structure, is then supplied from weight-and-sum circuit 694 to an adder 695 to be combined with altered $L_{(K-1)}$, delayed in time to align with the, resampled and filtered $G_{K'}$ (or $G_\Omega$) samples it is being added with. Multiplexer 692, shift register 693 and weight-and-sum circuit 694 may be multiplexed to serve as elements 472, 473 and 474 in the spectrum analysis process.

At this point it is well to consider the characteristics of the low-pass filtering to be used in the low-pass-filtering step of spectrum analysis procedure and in the expansion steps of the spectrum analysis and signal synthesis procedure. The low pass filtering is linear phase, so the pattern of filter weights is symmetric about the central sample(s). The filter weights sum to unity in order to suppress low frequency as much as possible in the high-pass spectrum $L_0$ and the band-pass spectra $L_1$, $L_2$, $L_3$, . . . . If spectrum analysis is to be by octaves, with decimation being by two in recoding of the sub-band removed by low-pass filtering in each spectrum analysis stage, one wishes to remove frequencies below two-thirds of octave center frequency during low-pass filtering. Step frequency response in the filter (so-called "brick wall" response) introduces overshoot in the filtered signals, increasing the dynamic range of both the $G_{(K+1)}$ function extracted by the spectrum analysis stage and the $L_{(K+1)}$ function generated by subtracting expanded $G_{(K+1)}$ from $G_K$. This is an example of Gibbs Phenomena, which can be moderated through the use of a less abrupt truncation of the Fourier series. A number of truncation windows giving filter response with reduced Gibbs Phenomenon are known; e.g. those attributable to Bartlett, to Hanning, to Hamming, to Blackman, and to Kaiser. Refer for example to section 5.5 of the book "DIGITAL SIGNAL PROCESSING" by A. V. Oppenheim and R. W. Schafer published by Prentice-Hall Inc., Englewood Cliffs, N.J., in 1975, which section is entitled "Design of FIR Filters Using Windows" and appears on pages 239-251.

In practice the number of samples in the low-pass filtering are usually limited to just a few. In a filter using an odd number of samples the filter response will comprise a direct component and a series of cosine harmonics, and in a filter using an even number of samples the filter response will comprise a direct component and a series of sine harmonics. The desired response curve is approximated to smoothest fit using a computer to perform trial and error selection of weighting coefficients.

It is possible to develop equal-Q spectra of non-octave widths in accordance with the invention, though such an approach appears to have restricted usefulness. Decimation of low-pass filter response to select every third sample and filtering away frequencies below half of band-pass spectrum center frequency to develop the low-pass response develops a set of band-pass spectra successively narrower in bandwidth by one-third, rather than one-half, for example.

Figure 7:
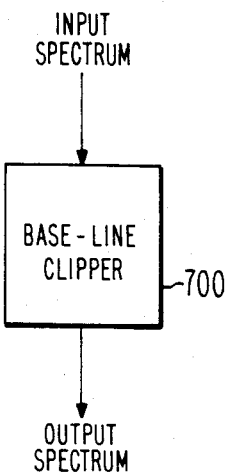
FIGS. 7, 8, 9 and 10 are block diagrams of representative spectrum alteration circuitry of FIG. 3 for use with the invention.

The sample alteration circuits 345-351 of FIG. 3 can take a variety forms and certain of them may be replaced by direct feedthroughs. To remove low-level background noise in the various spectra, for example, each of alteration circuits 345-351 may comprise a respective base-line clipper 700 per FIG. 7. Such a clipper 700 may be as simple as truncation of the less significant bits of the signal.

Figure 8:
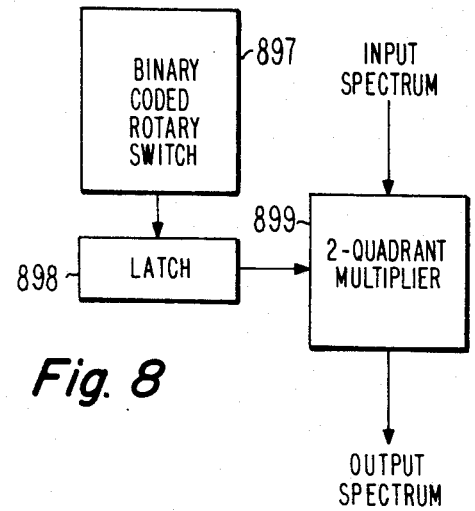

FIG. 8 shows a circuit that can be used for each of the alteration circuits 345-351 to provide for a spectrum equalizer. A rotary switch 897 is wired to provide a binary code for each of a plurality of shaft displacements. This code is supplied via a latch 898 to a two-quadrant multiplier to multiply input spectrum samples to generate output spectrum samples to be synthesized to generate $G_0'$. Latch 898 preserves code input to multiplier 889 while rotary switch 897 setting is being changed. One may arrange for each of the octave spectra to be subdivided, using digital filters employing the same sampling rate as used to develop the octave spectrum or a halved sampling rate, and thend individually adjust the gains of the spectral subdivisions. Subdivision of the octaves into twelfths provides for individual tone and half-tone adjustments of signals encoding music, for example.

Figure 9:
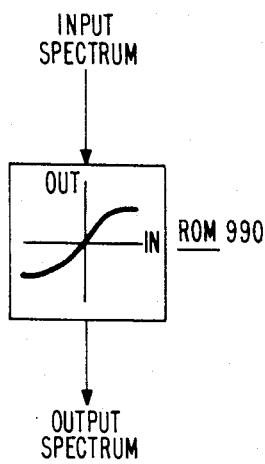
Figure 10:
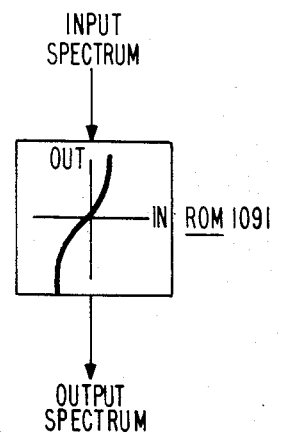

The alteration circuits can be read-only memories (ROM's) for storing non-linear transfer functions. For instance, a ROM 990 storing a logarithmic response to input signal per FIG. 9 may be used in each of sample alteration circuits 345-351 of a transmitting device, and a ROM 1091 storing an exponential response to input signal per FIG. 10 may be used in each of the corresponding sample alteration circuits of a receiving device, thereby providing for pre-emphasis of signal before transmission and de-emphasis after reception. Other complementary pre-emphasis and de-emphasis characteristics may alternately be stored in the ROM alteration circuits of transmitter and receiver spectrum-analyzer-signal-synthesizers.

Figure 11:
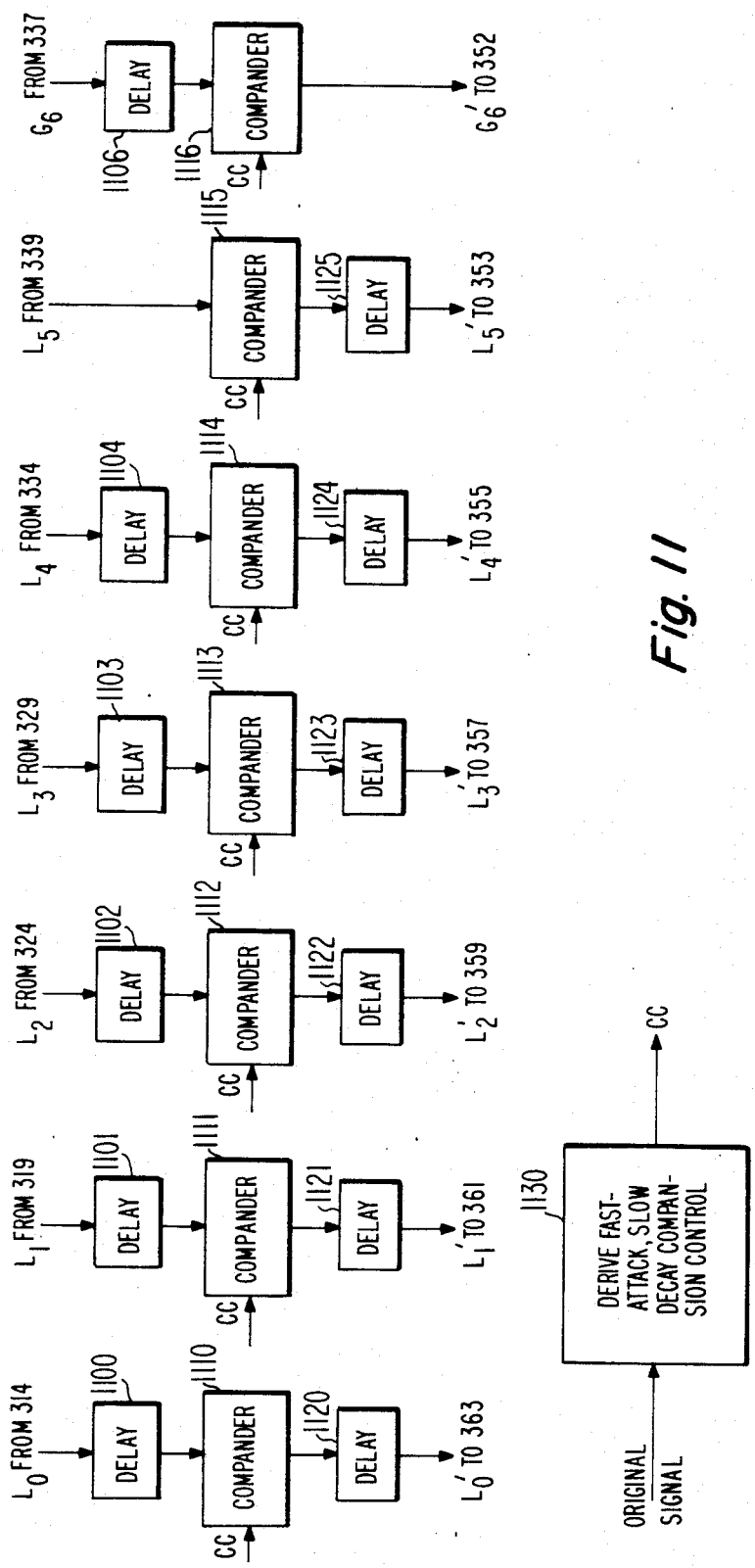
FIG. 11 shows in block diagram a modification to the FIG. 3 system, used when it is desirable to align spectrum samples in time for processing, in accordance with an aspect of the invention.

FIG. 11 shows a modification of the FIG. 3 spectrum analysis and signal synthesis system in which the delays between analysis and synthesis are partitioned to supply spectral samples without time skew for processing. Such alignment is desirable, for example, in a compansion system where spectrum analysis is used to separate signals into spectra before compansion, so the companded spectra can be filtered to suppress distortions generated during rapid signal compression or expansion. The amplitude of the original signal supplied to ADC 305 of FIG. 3 can be detected to derive in circuitry 1130 a compansion control signal CC that is supplied to each of companders 1110, 1111, 1112, 1113, 1114, 1115, 1116 to provide for fast-attack, slow-decay compansion of the signals they compand. Compandors 1111-1116 may essentially consist of two-quadrant digital multipliers, with the control signal CC being developed from an analog-to-digital converter cascaded after conventional analog circuits for detecting the signal to be companded and developing in response to that detection an analog compansion control signal.

Compandors 1111, 1112, 1113, 1114, 1115 and 1116 operate on the $L_0$, $L_1$, $L_2$, $L_3$, $L_4$, $L_5$ and $G_6$ spectra after they have been differentially delayed using delay circuits 1100, 1101, 1102, 1103, 1104 and 1106 to align their respective samples in time. Delay circuits 1120, 1121, 1122, 1123, 1124 and 1125 then skew the companded $L_0'$, $L_1'$, $L_2'$, $L_3'$, $L_4'$, $L_5'$ and $G_6'$ signals appropriately for the signal synthesis procedure using elements 352-363 of FIG. 3.

The delays in delay circuits 1106 and 1125 are essentially $M/2$ cycles of $R/2^K$ clock rate, K being five, or 16M cycles of basic clock rate R, which delay takes place in assembling the samples for weight-and-sum circuit 474 of the last spectrum analysis stage 335. This 16M cycles of delay is augmented by delay time $D_1$ to accommodate the addition times in expansion circuits 338 and 352 and by a delay time $D_2$ to accommodate addition times in delay and subract circuit 334 and in adder 353. All addition processes will be assumed to be performed at the basic clock rate R, and $D_1$ and $D_2$ are expressed as numbers of those clock cycles.

The delay in delay circuit 1104 will be longer than $16M+D_1+D_2$ cycles of clock rate R by the difference between the time it takes to develop $L_5$ from $G_3$ and the time it takes to develop $L_4$ from $G_5$. The time it takes to develop $L_5$ from $G_5$ is M cycles of $R/2^5$ clock rate to twice collect samples for weighting and summation, or 32M cycles of basic clock rate, plus $2D_1$ for two sets of sample summation, plus $D_2$ for sample subtraction. The time it takes to develop $L_4$ from $G_5$ is $M/2$ cycles of $R/2^4$ clock rate to colllect samples for weighting and summation, or 8M cycles of basic clock rate, plus $D_1$ for sample summation, plus $D_2$ for sample subtraction. It takes $24M+D_1$ cycles of basic clock rate extra delay to align $L_4$ samples in time with $L_5$ samples. So delay circuit 1104 will have a total delay of $40M+2D_1+D_2$ cycles of basic clock rate R. Similar calculations determine that the cycles of basic clock rate R by which samples are to be delayed in delay circuits 1103, 1102, 1101 and 1100 are $52M+3D_1+D_2$, $58M+4D_1+D_2$, $61M+SD_1+D_2$, and $(62\frac{1}{2})M+6D_1+D_2$, respectively.

The delay required of delay circuit 1124 in excess of that provided by delay circuit 1125 is the time taken for expansion in circuit 354 and the $D_2$ delay associated with addition in adder 55. The former delay is $M/2$ cycles of $R/2^4$ clock rate taken to colllect samples for weighting and summing, 8M cycles of basic clock rate R, plus $D_1$ associated with the summation in the weighting and summing process. Total delay in delay circuit 1124 is then $24M+D_1+D_2$. By similar calculations the total delays in delay circuits 1123, 1122, 1121, and 1120 in terms of cycles of basic clock rate R are $28M+3D_1+3D_2$, $30M+4D_1+4D_2$, $31M+5D_1+5D_2$, and $(31\frac{1}{2})M+6D_1+6D_2$ respectively.

Similar calculations can be used to determine the total delays in delay circuits 340-344 of FIG. 3 presuming alteration circuits 345-351 to all have equal delays. Delay circuits 340, 341, 342, 343 and 344 have respective delays in cycles of basic clock rate R of $77M+12D_1+7D_2$, $76M+10D_1+6D_2$, $72+8D_1+5D_2$, $64M+6D_1+4D_2$, and $48M+4D_1+3D_2$.

The digital filtering used in the spectrum analyzer is a species of hierarchial filtering of general interest in that low-pass or band-pass filtering which extends over many, many samples is accomplished with relatively small numbers of samples being weighted and summed at any time.

Although the present invention is applicable for utilizing the spectrum of a signal representing one-dimensional information, the Burt Pyramid was developed for analyzing primarily the spatial frequencies of two-dimensional image information. The present invention permits the real-time spectral analysis of the spatial-frequencies of changing image information, as occurs in successive video frames of a television display.

As known in the television art, successive video frames (in NTSC format) occur successively at a frame rate of 30 frames per second. Each frame is comprised of a raster of 525 interlaced horizontal scan lines. The successive odd-numbered horizontal scan lines of a frame are transmitted sequentially during a first field period. The successive even-numbered scan lines of a frame are transmitted sequentially during a second field period which follows the first field period. This is followed by the first field period of the next succeeding frame. The duration of each field period is 1/60th of a second. However, storage must be provided for at least the number of pixels in a field time to be able to define the full spatial frequency spectrum of the image in delayed real time.

A technique, known as progressive scanning, is known in the television art for deriving, from an NTSC video signal, successive full 525 line frames at a rate of 60 frames per second. This technique involves delaying each successive NTSC field for a field period of 1/60th of a second. Thus, the successive scan lines of a currently occurring odd field are interleaved with the successive scan lines of an immediately preceding even field which has been delayed by one field period to provide a full frame of image pixels during that currently-occurring odd field of each of successive frames. In a similar manner, the successive scan lines of a currently-occurring even field are interleaved with the successively occurring scan lines of an immediately preceding odd field that has been delayed by one field period to provide a full frame of pixels during that currently-occurring even field period of each of successive frames.

The progressive scanning technique, described above, is particularly useful in deriving high-resolution image displays in what is known as high definition television (HDTV) now being developed in the television art. The present invention is also useful in HDTV for providing improved image displays.

Figure 12:
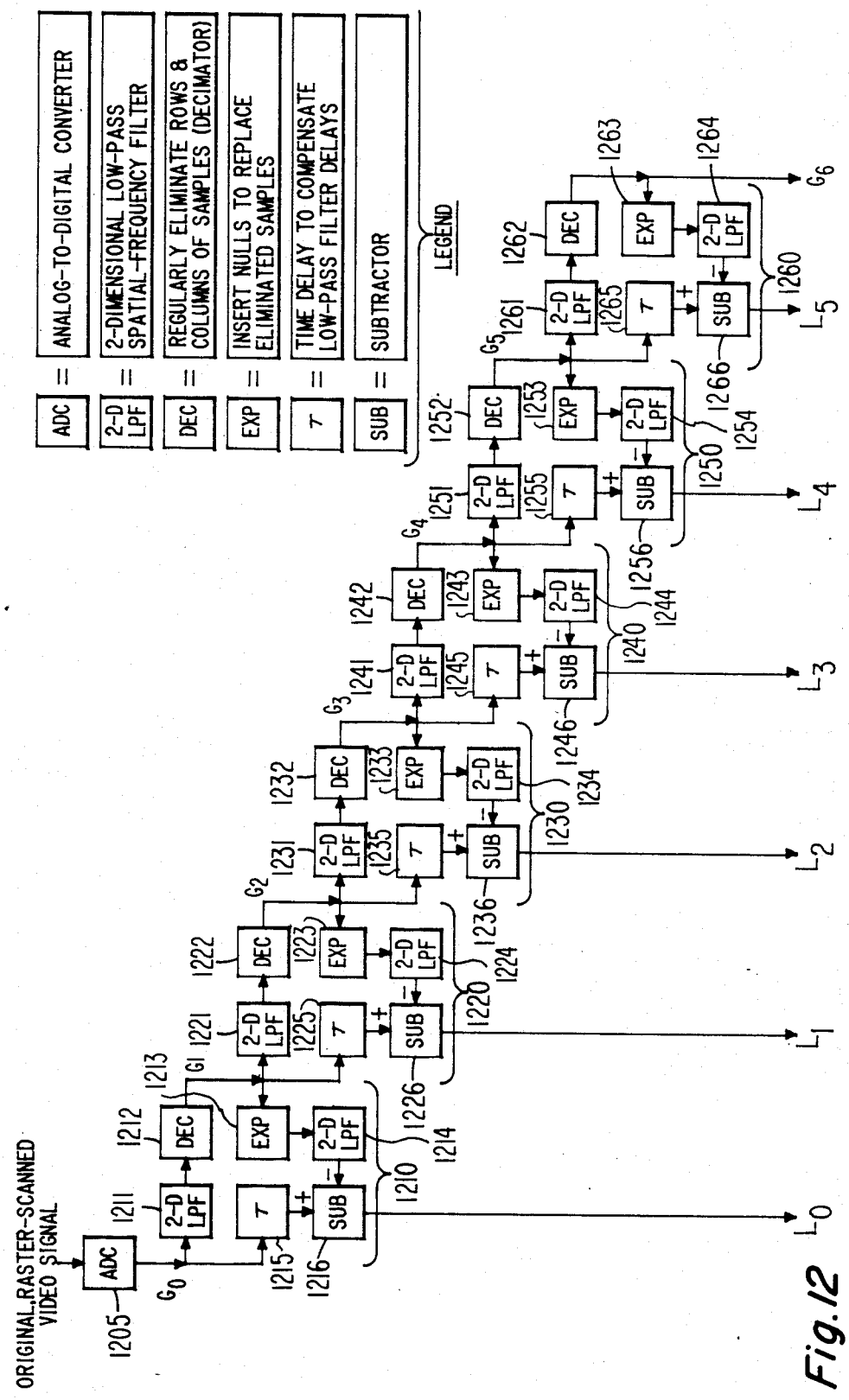
FIG. 12 is a block diagram of a two-dimensional spatial-frequency spectrum analyzer using pipe-like architecture to perform spectral analysis in delayed real time.

FIG. 12 shows a spectrum analyzer incorporating the principles of the present invention for operating on signals representing two-dimensional information, such as the spatial frequency image information contained in successive progressively scanned television video frames. However, alternatively, such two-dimensional information may be obtained from a non-interlaced television camera, or from a line-interlaced television camera followed by an appropriate buffer memory.

Monochrome processing of luminance signals will be described in FIG. 12 for sake of simplicity of description, but the techniques to be described can be applied individually to the primary colors of color television signals or to signals developed from them by algebraic matrixing. An original video signal is supplied in raster-scanned format to an analog-to-digital converter 1205 for sampling if unsampled, for resampling if already sampled, and for ultimate digitization. The digitized video samples, as signal, are denominated $G_0$ and contain the complete two-dimensional spatial-frequency spectrum of the original signal and the harmonic spectra thereof attributable to the sampling processes. These harmonic spectra are symmetric about respective ones of the sampling rate and its harmonics. These harmonic spectra will be treated specifically in the description that follows. The general fact of their existence is noted because the harmonic spectra must be considered in the design of the two-dimensional low-pass spatial-frequency filters used in the FIG. 12 spectrum analyzer. This is owing to these harmonic spectra giving rise to aliasing frequencies during spectral analysis and during signal synthesis from spectral analyses.

In the zero-order spectral analysis stage 1210 a high-pass spectrum $L_0$ is separated out of $G_0$. The high-pass operation is essentially performed through low-pass filtering $G_0$, delaying $G_0$ from its timing coming out of ADC 1205 to the same degree the lower frequency portions of $G_0$ are delayed in the low-pass filtering response, and subtracting the low-pass-filtering response from delayed $G_0$. Assuming that spectral analysis will proceed by octaves, the cut-off frequency in two-dimensional low-pass spatial-frequency filter 1211 is chosen to be the uppermost frequency of the next octave-bandwidth band-pass spectrum $L_1$ to be analyzed—i.e. four-thirds its center frequency. In decimator 1212 alternate rows and columns of samples are eliminated to sample low-pass filtered $G_0$ at R/2 spatial-frequency rate, which reduced-sample-rate signal is supplied as a low-pass output response of stage 1210 for further spectral analysis. The low-pass-filtered $G_0$ at reduced sample rate is then subjected to interpolation following the methods outlined by R. W. Schafer and L. R. Rabiner in their PROCEEDINGS OF THE IEEE, Vol. 61, No. 6, June 1973 article, "A Digital Signal Processing Approach to Interpolation", pp. 692–702. In expansion circuit 1213 the samples eliminated in decimator 1212 are replaced by nulls to provide input signal to another two-dimensional low-pass spatial-frequency filter 1214. This filter may use the same sample weighting coefficients as the initial low pass filter, but in any case has substantially the same cut-off frequency as the initial low-pass filter. The resulting signal has a sampling matrix coextensive with that of $G_0$, as delayed in delay circuit 1215, and is subtracted from delayed $G_0$ in subtractor 1216 to yield a high-pass output response $L_0$. $L_0$ is not only the high-pass portion $G_0$, but also contains lower-frequency phase error correction terms, as discussed above, to be used during re-synthesis of video signal from spectral analyses, for compensating for the errors introduced by resampling $g_0$ at lower sampling rate in decimator 12.

This separation of signal into a low-pass portion, which is resampled at halved rate, and into a high-pass portion is iterated in each spectrum analysis stage. Each successive spectrum analysis stage receives as its input signal the resampled low-pass output response of the preceding spectrum analysis stage, with the sampling rate being halved in each successive spectrum analysis stage from the rate in the preceding spectrum analysis stage. The high-pass output response of each spectrum analysis stage 1220, 1230, 1240, 1250, 1260 after the initial one 1210 has an upper limit imposed by the low-pass response characteristic of the preceding stage, so these "high-pass" output responses are in actuality equal-Q band-pass spectra of descending spatial frequency. The decimation of the responses of the initial low-pass filters in each stage being by a factor of two, and the cut-off frequency of the low-pass filters in each stage being two-thirds the center frequency of the spectrum analysis it generates, are the factors causing these equal-Q spectra to be descending octaves of two-dimensional spatial frequency.

The decimated low-pass output response $G_1$ of spectrum analysis stage 1210 is supplied from its decimator 1212 as input signal to the succeeding spectrum analysis stage 1220. Spectrum analysis stage 1220 has elements 1221, 1222, 1223, 1224, and 1226 analogous to elements 1211, 1212, 1213, 1214, 1215 and 1216 respectively of spectrum analysis stage 1210; the differences in operation owe to the sampling frequencies in stage 1220 being halved in both dimensions respective to stage 1210. Low-pass filters 1221 and 1224 have weighting coefficients like those of low-pass filters 1211 and 1214, respectively; but the halving of the sampling rate in stage 1220 as compared to stage 1210 halves the cut-off frequencies of filters 1221 and 1224 as compared to filters 1211 and 1214. The delay before subtraction in the delay circuit 1225 is twice as long as in the delay circuit 1215; presuming these delays to be clocked delays in a shift register or the like, the delay structures are alike with the 2:1 ratio of delay being provided by the 1:2 ratio of respective delay clocking rates in delay circuit 1225 and delay circuit 1215. The high-pass output response $L_1$ of spectrum analysis stage 1220 is a band-pass spectrum of spatial frequencies immediately below the spectrum $L_0$.

The decimated low-pass output response $G_2$ of spectrum analysis stage 1220 is supplied from its decimator 1222 as an input signal to the succeeding spectrum analysis stage 1230. The band-pass spectrum $L_2$ an octave below $L_1$ is the high-pass output response of spectrum analysis stage 1230 to its input signal $G_2$. Spectrum analysis stage 1230 comprises elements 1231, 1232, 1233, 1234, 1235 and 1236, respectively corresponding to elements 1221, 1222, 1223, 1224, 1225 and 1226 of spectrum analysis stage 1220, except for halved sampling rates.

The decimated low-pass output response $G_3$ of spectrum analysis stage 1230 is supplied from its decimator 1232 as input signal to the succeeding spectrum analysis stage 1240. The band-pass spectrum $L_3$ an octave below $L_2$ is the high-pass output response of spectrum analysis stage 1240 to its input signal $G_3$. Spectrum analysis stage 1240 comprises elements 1241, 1242, 1243, 1244, 1245 and 1246, respectively corresponding to elements 1231, 1232, 1233, 1234, 1235 and 1236 of spectrum analysis stage 1230, except for halved sampling rates.

The decimated low-pass output response $G_4$ of spectrum analysis stage 1240 is supplied from its decimator 1242 as input signal to the succeeding spectrum analysis stage 1250. The band-pass spectrum $L_4$ an octave below $L_3$ is the high-pass output response of spectrum analysis stage 1250 to its input signal $G_4$. Spectrum analysis stage 1250 comprises elements 1251, 1252, 1253, 1254, 1255 and 1256 respectively corresponding to elements 1241, 1242, 1243, 1244, 1245 and 1246 of spectrum analysis stage 1240, except for halved sampling rates.

The decimated low-pass output response $G_5$ of spectrum analysis stage 1250 is supplied from its decimator 1252 as input signal to the succeeding spectrum analysis stage 1260. The band-pass spectrum $L_5$ an octave below $L_4$ is the high-pass output response of spectrum analysis stage 1260 to its input signal $G_5$. Spectrum analysis stage 1260 comprises elemental 1261, 1262, 1263, 1264, 1265 and 1266 respectively corresponding to elements 1251, 1252, 1253, 1254, 1255 and 1256 of spectrum analysis stage 1250, except for halved sampling rates.

The decimated low-pass output response $G_{106}$ supplied from the decimator of the final spectrum analysis stage, $G_{106}$ here being $G_6$ supplied from decimator 1262 of spectrum analysis stage 1260, is a remnant low-pass spectral response. It serves as the foundation for re-synthesis of signals by summing interpolated band-pass spectral responses of the later spectrum analysis stages and the capstone high-pass spectral response of the initial spectrum analysis stage. $L_0, L_1, L_2, L_3, L_4$ and $L_5$ are in time skew, being supplied with increasing amounts of delay. The remnant low-pass spectrum $G_\Omega$ (here $G_6$) precedes in time the last band-pass spectrum $L_{\Omega-1}$ (here $L_5$) in an oppositely directed time skew.

As will be described hereinafter iterative methods of signal synthesis from spectral components also requires the $L_0, L_1, L_2, L_3, L_4$ and $L_5$ spectral components to be in this oppositely directed time skew respective to each other. Before describing the processing of spectral analyses and the synthesizing of signals from the processed spectral analyses, a more detailed description of the structures of the spectrum analysis stages follows. The first consideration will be of the initial two-dimensional low-pass filter structures.

As known in the filter design art, two-dimensional filter structures can be either non-separable in nature, or, alternatively, separable in nature. Separable filtering in first and second dimensions can be accomplished by first filtering in a first direction employing a first one-dimensional filter and then filtering in a second direction orthogonal to the first direction employing a second one-dimensional filter. Thus, since the respective low-pass filter characteristics of two separate cascaded one-dimensional filters comprising a separable two-dimensional low-pass filter are completely independent of one another, the kernel function and structure of each of these low-pass filters can be similar to that described above in connection with FIGS. 2a and 2b and FIGS. 3-11.

In the case of television images, comprised of the raster of horizontal scan lines, the two orthogonal directions of a separable filter are preferably horizontal and vertical. If separable two-dimensional low-pass filtering is employed in implementing the present invention, there are certain advantages to be gained in performing the horizontal low-pass filtering before the vertical low-pass filtering, while there are other advantages to be gained in performing the vertical low-pass filtering before the horizontal low-pass filtering. For instance, performing the horizontal filtering and decimation first, reduces by one-half the number of pixel samples per horizontal scan line that have to be operated on by the vertical kernel function during the subsequent vertical filtering. However, performing the vertical filtering first makes it possible to utilize the same delay structure that is required to provide the relatively long delay needed for vertical filtering and to provide also the respective compensating delays (1215, 1225, 1235, 1245, 1255, and 1265) for forwarding the respective signals $G_0$-$G_5$ to the positive terminal of each of respective subtractors 1216, 1226, 1236, 1246, 1256, and 1266 of stages 1210, 1220, 1230, 1240, 1250 and 1260 of the spectrum analyzer shown in FIG. 12.

The overall filter responses of separable two-dimensional spatial-frequency filters can be square or rectangular in cross-section parallel to the spatial frequency plane. However, the filter responses of non-separable filters can have other cross-sections. Circular and eliptical cross-sections are of particular interest for filtering raster-scan television signals, since filters with responses having such cross-sections can be used to reduce excessive diagonal resolution in the television signals. Uniformity of image resolution in all directions is important, for example, in television systems where the image is to be rotated between camera and display device.

Shown below, is a matrix of filter weights having a pattern that exhibits quadrantal symmetry and linear phase response—filter characteristics particularly suitable for use as the 2-D low-pass filters 1211, 1221, 1231, 1241, 1251, and 1261 and 2-D low-pass filters 1214, 1224, 1234, 1244, 1254, and 1264 of FIG. 12.

| A | B | C | B | A |
|---|---|---|---|---|
| D | E | F | E | D |
| G | H | J | H | G |
| D | E | F | E | D |
| A | B | C | B | A |

A kernel function matrix having this pattern of weighting factors operates, in turn, on each of successive image samples, wherein each pixel sample, when operated upon, corresponds in position to centrally-located weighting factor J of the matrix. In a low-pass filter, weighting factor J has the highest relative magnitude level and each of the other weighting factors has a magnitude level that becomes smaller the further away it is located from the central position. Therefore, the corner weighting factors A have the lowest magnitude level.

In the case of a non-separable two-dimensional filter, the specific selected values of the level magnitudes of A, B, C, D, E, F, G, H and J are completely independent of one another. However, in the case of a two-dimensional separable filter, since the level magnitudes of the weighting factors result from the cross product of the respective values of the horizontal and of the vertical one-dimensional kernel weighting factors, the respective values of A, B, C, D, E, F, G, H and J are not completely independent of one another.

Specific examples of non-separable and separable filter circuitry suitable for use in spectrum analyzer of FIG. 12 are disclosed in British Incomplete patent application No. 83/17407, filed by the assignee of the present application on June 27, 1983. This British Incomplete application comprises a priority document for the present application under 35 USC 119.

Figure 13:
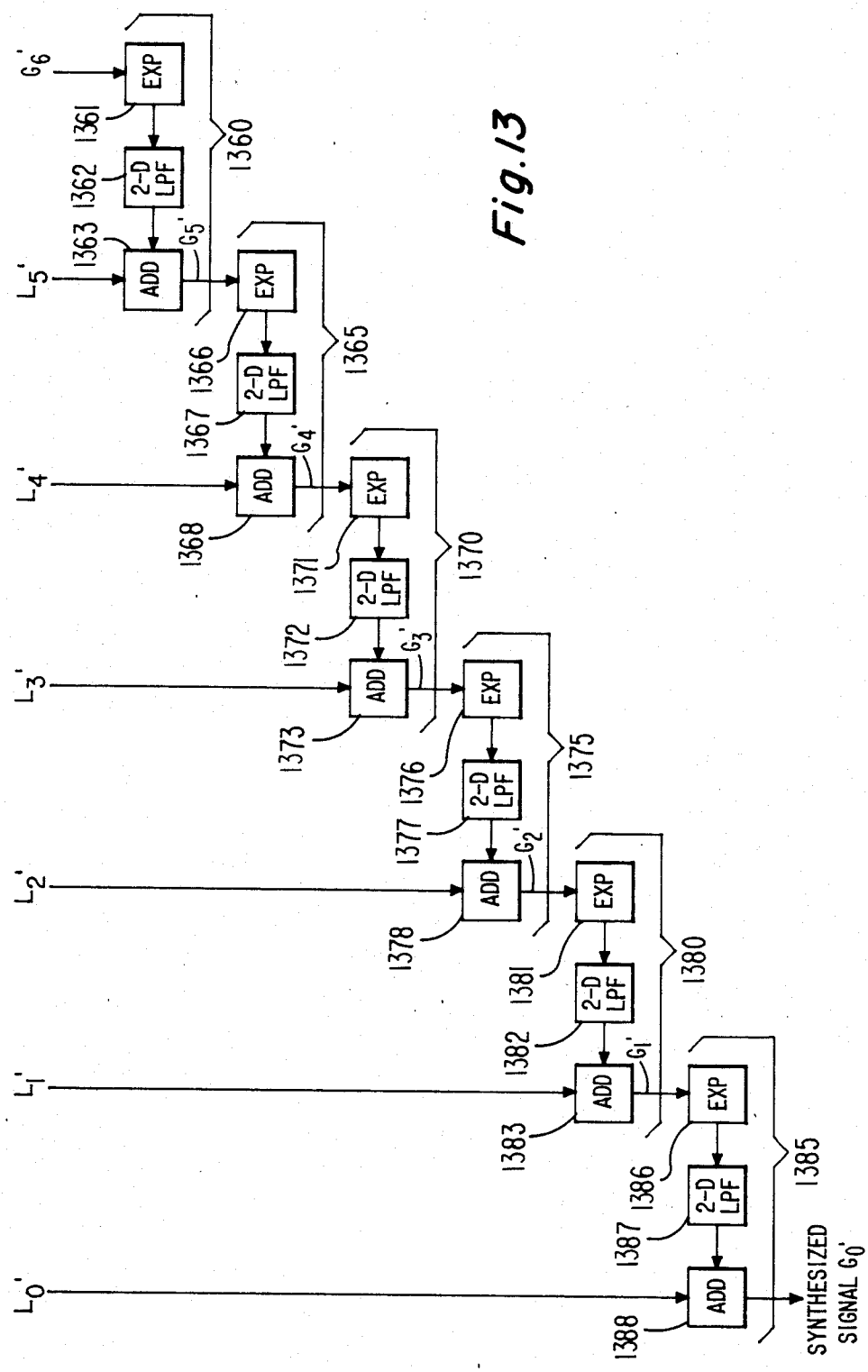
FIG. 13 is a block diagram of apparatus for synthesizing signals descriptive of the sample field analyzed by the FIG. 12 spectrum analyzer from its output spectra.

Apparatus for synthesizing an electric signal from component spectra, which may take the general form shown in FIG. 13 is of importance to the invention. The spectrum components $G_6'$, $L_5'$, $L_4'$, $L_3'$, $L_2'$, $L_1'$ and $L_0'$ are responses to their unprimed counterparts supplied from the FIG. 12 spectrum analyzer apparatus. The spectrum components $L_0$, $L_1$, $L_2$, $L_3$, $L_4$, $G_6$ and $L_5$ are furnished progressively later in time by the FIG. 12 spectrum analyzer and must be differentially delayed to provide $G_0'$, $L_5'$, $L_4'$, $L_3'$, $L_2'$, $L_1'$ and $L_0'$ progressively later for the signal synthesizer of FIG. 13.

FIG. 13 shows a signal synthesizer with a plurality of successive signal synthesis stages 1360, 1365, 1370, 1375, 1380, 1385. Each stage, through the use of inter-polation, expands the example matrix of a spectral component to be co-extensive with that of the spectral component next higher in spatial frequency and allows its addition to that spectral component. The expansion of the sample matrix is done by interleaving the sample points in the matrix with nulls and low-pass filtering the result to remove harmonic structure. The low-pass filtering preferably has the same filter characteristic as the low-pass filtering associated with the corresponding interpolative process in the FIG. 12 spectrum analyzer.

The low-pass filtering associated with interpolation in the signal synthesizer suppresses harmonics associated with the $G_\Omega$ or $L_K$ signals being altered by a non-linear process, which may arise in alteration circuits (such as described above in connection with FIG. 3) that can be inserted between the spectrum analyzer of FIG. 12 and the synthesizer of FIG. 13. Such non-linear processes would give rise to visible aliasing artifacts in the synthesized composite image were it not for the low-pass filtering associated with the interpolative processes used in the signal synthesizer.

In the FIG. 13 synthesizer, samples of the low-pass spectrum $G_6'$ are interleaved with nulls in expansion circuit 1361 and passed through a two-dimensional low-pass spacial-frequency filter 1362, similar to filter 1265 of the FIG. 12 spectrum analyzer. Samples of the response of filter 1362 are added to samples of $L_5'$ in an adder 1363 to generate $G_5'$, similar to or identical with hypothetical delayed-in-time replica of $G_5$. Then $G_5'$ samples are interleaved with nulls in expansion circuit 1366. This signal is passed through a low-pass filter 1367, similar to low-pass-filter 1254 of FIG. 12, and added to $L_4'$ in an adder 1368 to generate $G_4'$, similar to or identical with a delayed in time replica of $G_4$. The samples of $G_4'$ are interleaved with nulls in expansion circuit 1371 and the result low-pass filtered in a filter 1372, similar to filter 1244 of FIG. 12. Filter 1372 response is added to $L_3'$ in an adder 1373 to generate $G_3'$, similar to or identical with a delayed replica of $G_3$. The samples of $G_3'$ are interleaved with nulls in expansion circuit 1376 and the result low-pass filtered in a filter 1377 similar to filter 1234 of FIG. 12. Filter 1377 response is added to $L_2'$ in an adder 1378 to generate $G_2'$, similar to or identical with a delayed replica of $G_2$. The $G_2$ samples have nulls inserted between them in expansion circuit 1381, and the result is low-pass filtered in a filter 1382. Filter 1382 response is added with $L_1'$ in an adder 1383 to generate $G_1'$, similar to or identical with $G_1$ with delay. The samples of $G_1'$ are supplied for interpolation to an expansion circuit 1386 and a low-pass filter 1387 similar to filter 1214 of FIG. 12. Filter 1387 response is summed with $L_0'$ in an adder 1388 to provide $G_0'$, the synthesized signal descriptive of the same image described by $G_0$, possibly with alterations.

The aforesaid British Incomplete patent application No. 83/17407, discloses specific examples of structure that can be employed in implementing the 2-D signal synthesizer of FIG. 13. These specific examples of structure include both the case in which non-separable two-dimensional spatial-frequency filtering is employed and the case in which separable two-dimensional spatial-frequency filtering is employed.

While the two-dimensional implementation of the present invention is particularly suitable for use in image processing the spatial frequency spectrum of images in real time, it is to be understood that the two-dimensional information with which the present invention is concerned is not confined to the spatial frequency spectrum of two-dimensional images. For instance, one of the two dimensions may correspond to spatial frequency information and the other of the two dimensions may correspond to a temporal frequency information.

Furthermore, the present invention is useful in analyzing the real time frequency spectrum of information defined by more than two dimensions. For instance, in the case of three-dimensional information, all of the three dimensions may correspond to spatial information, or, alternatively, two of the dimensions may correspond with spatial information while the third dimension corresponds with temporal information. Of interest in this regard is image processing apparatus which is responsive to the occurrence of motion in a displayed television picture. In this case, the portion of the spatial frequency spectrum of the displayed image that corresponds with stationary objects remains the same from video frame-to-frame of the video information, while the portion of the spatial frequency spectrum of the displayed image that corresponds to moving objects changes from frame-to-frame of the video information. A spectrum analyzer incorporating the principles of the present invention can be utilized in such image processing apparatus utilizing 3-D low-pass filters. Two of the three dimensions of these low-pass filters are spatial and corresond with the two spatial dimensions of the 2-D low-pass filters incorporated in each stage of the two-dimensional spectrum analyzer of FIG. 12. The third dimension is temporal and corresponds with the fine-structure characteristics of the three dimensional spectrum due to changes caused by moving objects in the values of the magnitude levels of corresponding pixels of the displayed image from frame-to-frame.

In the above description of embodiments of the present invention, it has been assumed that the temporal signal $G_0$ is a baseband signal having a frequency spectrum that defines information having one or more dimensions. As known, such baseband information is often communicated in frequency-multiplexed format, in which the baseband information is comprised of the sidebands of a carrier frequency that has been modulated by a baseband information component. By employing suitable modulators and demodulators in the respective translation means 100-1 ... 100-N of FIG. 1, $G_0$ and/or any of $G_1$ ... $G_N$ and/or any of $L_0$ ... $L_{N-1}$ could be frequency multiplexed signals.

Ther term "shift register" is to be construed in the claims to include means performing the equivalent function—e.g., a read-then-write serial memory.

What is claimed is:

1. Signal processing apparatus responsive to a given temporal signal that defines an information component having a frequency spectrum, said apparatus employing pipe-line architecture for analyzing in delayed real time the frequency spectrum of said information component of said given temporal signal, wherein said component corresponds to information having a given number of dimensions, and wherein said frequency spectrum includes a highest frequency of interest which is no greater than a frequency $f_0$; said apparatus comprising:
   a set of N ordinally arranged sampled-signal translation means (where N is a plural integer), each one of said translation means including first and second input terminals and first and second output terminals; said first input terminal of each one of said second to said Nth translation means of said set being coupled to said first output terminal of its immediately preceding one of said translation means of said set for forwarding a signal from each one of said translation means to its immediately following one of said translation means of said set;
   means for applying said given temporal signal to said first input terminal of the first translation means of said set; and
   means for applying a separate sampling frequency clock to the second input terminal of each one of said translation means of said set to derive a sample rate for respective signals derived at said first and second output terminals of that translation means equal to the sampling frequency of the clock applied thereto; wherein:
   each one of said translation means of said set exhibits for said information component a low-pass transfer function between its first input terminal and its first output terminal, said low-pass transfer function of each translation means of said set having a nominal cut-off frequency that is a direct function of the sampling frequency of the clock applied to the second input terminal of that one of said translation means of said set;
   the clock applied to the second input terminal of said first translation means of said set has a sampling frequency that (1) is twice $f_0$, and (2) provides for said information component a nominal cut-off frequency for said low-pass transfer function of said first translation means of said set which is less than $f_0$;
   the clock applied to the second input terminal of each one of said second to Nth translation means of said set has a sampling frequency that (a) is less than the clock frequency applied to the second input terminal of its immediately preceding one of the translation means of said set, (b) is at least equal to twice any frequency of the information component of the signal applied to its first input terminal, and (c) provides a nominal cut-off frequency for its low-pass transfer function which is less than that of its immediately preceding translation means of said set; and
   the information component of said signal derived at said second output terminal of each one of said translation means of said set corresponds to a subtractive difference between the information component of the signal applied to said first input terminal thereof and a direct function of the information component of the signal derived at the first output terminal thereof.

2. The apparatus defined in claim 1, wherein the clock applied to the second input terminal of each one of said second to Nth translation means of said set has a sampling frequency relative to the sampling frequency of the clock applied to the second input terminal of its immediately preceding one of the translation means of said set such that:
   each particular dimension of the information component of the signal applied to its first terminal is sampled at a rate which is one-half the rate at which that particular dimension of the information component of the signal applied to the first terminal of said immediately preceding one of the translation means of said set is sampled.

3. The apparatus defined in claim 2, wherein the clock applied to the second input terminal of each one of said second to Nth translation means of said set has a sampling frequency relative to the sampling frequency of the clock applied to the second input terminal of the immediately preceding one of the translation means of said set such that:
   there is provided a nominal cut-off frequency for its low-pass transfer function that, for each dimension of the information component of said signal applied to its first terminal, is substantially one-half of the nominal cut-off frequency provided for the corresponding dimension of this information component by the low-pass transfer function of said immediately preceding one of said translation means of said set;
   whereby the information component of said signal derived at said second output terminal of each one of said translation means of said set corresponds in each dimension thereof with a different octave of the frequency spectrum of the information component of said given temporal signal in that dimension.

4. The apparatus defined in claim 1, wherein said given temporal signal is an analog signal comprised of an information component corresponding to one-dimensional information.

5. The apparatus defined in claim 1, wherein said given temporal signal is comprised of a video signal defining two-dimensional image information.

6. The apparatus defined in claim 5, wherein said video signal corresponds to successive frames of scanned television images.

7. The apparatus defined in claim 1, wherein each one of said translation means of said set is comprised of:

first means coupled to the first and second input and first output terminals of that one translation means for providing said low-pass transfer function of that one translation means;

said first means including an m-tap convolution filter (where m is a given plural integer of three or more, for convolving the information component of the signal applied to the first terminal of that one translation means with a predetermined kernel function at a sampling frequency corresponding to that of the clock applied to the second input terminal of that one translation means, said predetermined kernel function and said sampling frequency of the convolution filter of that one translation means defining respectively shape and nominal cut-off frequency characteristics of the low-pass transfer function of that one translation means in each dimension of said information component; and second means coupled to said first means and to the second input and second output terminals of that one translation means for deriving said difference signal at the second output terminal of that one translation means;

said second means including sample-subtractive means and third means comprising delay means for coupling said sample-subtractive means through said delay means to said first means for subtracting in temporal alignment, at the sampling frequency of convolved samples of that one translation means, each of the successively-occurring respective sample levels of convolved samples of that one translation means from each of corresponding successively-occurring respective levels of the information component of the signal applied to the first input terminal of that one translation means prior to its being convolved with said predetermined kernel function of the convolution filter of that one translation means, whereby said sample-subtracting means output comprises each of successively-occurring respective difference sample levels, at the sampling frequency of the convolved samples of that one translation means, said respective difference sample levels constituting the information component of the signal derived at the second output terminal of that one translation means.

8. The apparatus defined in claim 7, wherein said predetermined kernel function of at least one of said translation means of said set defines a low-pass transfer-function shape for that translation means having a gradual roll-off that extends beyond said nominal cut-off frequency thereof.

9. The apparatus defined in claim 7, wherein said respective predetermined kernel functions of at least two of said translation means of said set are substantially similar to one another.

10. The apparatus defined in claim 7, wherein:
said information component is comprised of at least two dimensions, and
the convolution filter of at least one of said translation means is a non-separable filter in at least said two dimensions.

11. The apparatus defined in claim 7, wherein:
said information component is comprised of at least two dimensions, and
the convolution filter of at least one of said translation means is a separable filter in said two-dimensions.

12. The apparatus defined in claim 7, wherein:

said first means of at least one of said translation means of said set is of a given type, said given type of first means being comprised of said convolution filter and a decimator serially coupled between an output of said convolution filter and the first output terminal of that one of said translation means of said set;

said convolution filter of said given type of first means derives at its output a particular sample density in each dimension of said information component that corresponds with the sampling frequency of the clock applied to the second input terminal of that one translation means, and said decimator of said given type of first means forwards, in each of said dimensions of said information component, only certain ones, but not all, of the convolved samples appearing at the output of the convolution filter of said given type of first means to said first output terminal of that one translation means, whereby, in each of said dimensions of said information component at said first output terminal of that one translation means, its sample density is reduced with respect to a corresponding sample density in that dimension of said information component at the output of the convolution filter of that one translation means.

13. The apparatus defined in claim 12, wherein said decimator of said given type of first means forwards, in each of said dimensions of said information component, every other one of the samples appearing at the output of the convolution filter of said given type of first means to said first output terminal of that one translation means, whereby said decimated sample density, in each of said dimensions of said information component, is reduced to one-half said particular sample density of the corresponding dimension of said information component.

14. The apparatus defined in claim 12, wherein:
said third means further includes fourth means coupled between said decimator and said sample-subtracting means for expanding the decimated sample density of said convolved samples in each dimension of said information component, at said first output terminal of that one translation means, back to said particular sample density of said convolved samples in that dimension, at said sample-subtracting means, said fourth means including a sample expander for inserting additional samples that respectively correspond in occurrence to each convolved sample at the output of said convolution filter that is absent from said decimated sample density, each of said inserted additional samples having a zero-value level, and an interpolation means that is effective in substituting an interpolated-value sample level for said zero-value level of each of said inserted additional samples.

15. The apparatus defined in claim 14, wherein:
said decimator of said given type of first means forwards, in each of said dimensions of said information component, every other one of the samples appearing at the output of the convolution filter of said given type of first means to said first output terminal of that one translation means, said expander inserts an additional sample in between each pair of successive convolved samples of said decimated sample density in each dimension of said information component, and said interpolation means is comprised of an n-tap interpolation filter (where n is a given plural integer of three or more) having a low-pass transfer function.

16. The apparatus defined in claim 14, wherein:
said convolution filter, said decimator and said fourth means of that one translation means insert a certain total time delay;
the information component of the signal at the first input terminal of that one translation means is applied to said sample-subtracting means thereof through said delay means thereof; and
said delay means of that one translation means inserts a time delay substantially equal to said total time delay inserted by said convolution filter, said decimator and said fourth means of that one translation means.

17. The apparatus defined in claim 12, wherein each of said first to said (N−1)th translation means of said set includes a first means of said given type.

18. The apparatus defined in claim 17, wherein said Nth translation means of said set also includes a first means of said given type.

19. The apparatus defined in claim 17, wherein said Nth translation means of said set includes a first means of an alternative type in which the output of said convolution means is applied directly to said first output terminal of said Nth translation means.

20. The apparatus defined in claim 19, wherein the information component of the signal at the first input of said Nth translation means of said set is applied to said sample-subtracting means thereof through said delay means thereof, said delay means of said Nth translation means of said set inserting a time delay substantially equal to that inserted by said convolution filter thereof.

21. Apparatus for performing real-time spectral analysis comprising:
a cascade connection of low-pass sampling filters operated at successively lower sampling rates, the input signal to said cascade being the signal upon which spectral analysis is to be performed and the output signal being a remnant low-pass spectrum;
means for interleaving the samples of a decimation of a response of each said low-pass sampling filter with nulls and low-pass filtering a resultant interleaved output of said interleaving means to obtain a respective interpolation result;
means for delaying the samples of the input to each low-pass filter in said cascade connection in amount equal to a sum of the delay in response to that filter and the delay in the low-pass filtering of that response interleaved with nulls; and
means for differentially combining the delayed samples of the input to each low-pass filter in said cascade connection with the interpolation result derived from its response, thereby to provide a respective one of the spectrum analyses of the input signal to said cascade connection.

22. Apparatus for performing real time spectral analysis of an electric signal regularly sampled at a rate R comprising a plurality, n in number, of analysis stages consecutively cardinally numbered zero through n for providing as a first output signal and a second output signal thereof separate responses to lower frequency components of its input signal and to higher frequency components of its input signal, the one of said analysis stages numbered zero receiving said electric signal for spectral analysis as its input signal and each other of said analysis stages receiving as its input signal the first output signal of the analysis stage with a next lower cardinal number, said second output signals and the first output signal of the analysis stage numbered n providing the spectral analysis, each of said plurality of analysis stages respectively including:
a first m-stage shift register, m being a positive integer, having the input signal for said analysis stage to its input and being clocked at a clock rate equal to $R/2^k$, k being a cardinal number of the analysis stage;
means weighting the input signal of the analysis stage and that input signal as delayed in each stage of said first m-stage shift register by a set of coefficients and summing the weighted signals for generating a linear-phase low-pass-filtered response to said analysis stage input signal, which response is said analysis stage first output signal;
a multiplexer operated to alternately select between said analysis stage first output signal and a null value at said $R/2^{(k-1)}$ rate;
a further m-stage shift register having the signal selected by said multiplexer applied to its input and being clocked at said clock rate equal to $R/2^{(k-1)}$;
means weighting the selected signal of that analysis stage and that signal as delayed in each stage of said of said further m-stage register by said set of weighting coefficients and summing the weighted signals to obtain a re-sampled first output signal for that analysis stage; and
means subtractively combining said re-sampled first output signal for that analysis stage with delayed input signal for that analysis stage, for generating the second output signal for that analysis stage.

23. Apparatus as set forth in claim 22 wherein m is the same for each analysis stage and wherein each analysis stage uses similar value sets of weighting coefficients.

24. Apparatus as set forth in claim 22 wherein said delayed input signal for each analysis stage is obtained from the mth stage of its first m-stage shift register and additionally delayed.

25. A digital filter providing at least one output response and comprising:
a plurality of clocked delay lines having taps consecutively ordinally numbered;
means for clocking said delay lines at successively lower rates as their ordinal numbering increases;
means for applying an input signal to be filtered to the input of the first of said plurality of delay lines;
respective means for weighting samples from said taps of each delay line and combining the weighted samples to obtain a respective filter response;
means for applying the respective filter response derived from the samples taken from each delay line except that with the highest ordinal numbering as input to the delay line with next highest ordinal numbering, at least a portion of the respective filter response derived from the samples taken from the delay line with the highest ordinal numbering being used in the generation of said overall response.

26. A digital filter as set forth in claim 25 wherein the weighted samples from the taps of each delay line are combined to obtain respective filter responses low-pass in nature.

27. A digital filter as set forth in claim 26 wherein the one of the respective filter responses obtained by weighting and combining the samples taken from the delay line with the highest ordinal numbering is used as an output response of said digital filter.

28. A digital filter as set forth in claim 26 including:
a further tapped clocked delay line clocked at the same rate as a selected one of said plurality of tapped delay lines;
means for selectively applying the output of the selected delay line and nulls to the input of said further delay line;
means for weighting samples from the taps of said further delay line and combining the samples to obtain a low-pass filter response; and
means for differentially combining the low-pass filter response thus obtained with the output of the selected one of the delay lines in said plurality for generating an output response of said digital filter.

29. A digital filter as set forth in claim 26 wherein the weighted samples from the taps of a selected one of said plurality of tapped delay lines having an ordinal number one higher than a preceding delay line, are weighted differently on alternate ones of the clock cycles of said preceding delay line and combined on each of those clock cycles to obtain a low-pass filter response; and wherein the low-pass filter response thus obtained is differentially combined with the output of said preceding delay line to generate an output response of said digital filter.

30. A digital filter as set forth in claim 25 including:
a further tapped clocked delay line clocked at the same rate as a selected one of said plurality of tapped delay lines;
means for selectively applying the output of the selected delay line and nulls to the input of said further delay line;
means for weighting samples from the taps of said further delay line and combining the samples to obtain a response; and
means for combining the response thus obtained with the delayed input to the preceding delay line for generating an output response of said digital filter.

31. A digital filter as set forth in claim 30 where the delayed input to the preceding delay line is obtained by incorporating the delay to one of its taps.

32. A digital filter as set forth in claim 25 wherein the weighted samples from the taps of a selected one of said plurality of tapped delay lines, having an ordinal number one higher than a preceding delay line, are weighted differently on alternate ones of the clock cycles of the preceding delay line and combined on each of those clock cycles the result being combined with the delayed input to the preceding delay line to generate an output response of said digital filter.

33. A digital filter as set forth in claim 32 where the delayed input to the preceding delay line is obtained by incorporating the delay to one of its taps.

34. Signal processing apparatus employing pipe-line architecture for synthesizing in delayed real time a single temporal signal from an ordinally-arranged set of N separate temporal signals; wherein:
(1) said single temporal signal is comprised of a certain stream of information-component samples that defines the frequency spectrum of information having a given number of dimensions with a particular sample density in each of said dimensions;
(2) the first of said ordinally-arranged set of N separate signals is comprised of a stream of information component samples that defines an uppermost portion of the frequency spectrum of said information with a sample density which is substantially the same as said particular sample density in each of said dimensions;
(3) each of the second to (N−1)th of said ordinally arranged set of N separate signals is comprised of a stream of information component samples that defines an individual portion of the frequency spectrum of said information in each dimension thereof which is below that of a corresponding dimension of said spectrum of that portion defined by its immediately preceding separate one of the signals of said set and is above that of a corresponding dimension of said spectrum of that portion defined by its immediately following separate one of the signals of said set;
(4) said stream of information component samples corresponding to each of the second to (N−1)th of said ordinally arranged set of N separate signals has a sample density for each of its own information dimensions which is smaller than the sample density of the corresponding information dimension of a stream of information component samples corresponding to its immediately preceding separate signal of said set; and
(5) said respective streams of information component samples occur in predetermined time skew relationship with respect to one another;

said apparatus comprising:
a group of (N−1) sampled-signal combining means each of which is individually associated with each of said first to said (N−1)th ordinal ones of said set of separate signals for combining that ordinal one of said set of separate signals with which that combining means is associated with a cumulative total of all those separate signals which follow that ordinal one separate signal in said set; wherein
each of said combining means associated with said first to said (N−2)th ordinal ones of said set of separate signals includes an adder, first means for forwarding its associated ordinal separate signal as a first input to its adder, and second means for forwarding the output of the adder of the combining means associated with a separate signal immediately following its ordinal separate signal as a second input to its adder with the same sample density as that of its ordinal separate signal;
said combining means associated with said (N−1)th separate signal of said set includes an adder, said first means for applying said (N−1)th separate signal as a first input to its adder, and third means for applying said Nth separate signal as a second input to its adder with the same sample density as said (N−1)th separate signal; and
said respective first means, said respective second means and said third means of said (N−1) combining means of said group inserting respective predetermined amounts of time delay in forwarding said time-skewed separate signals of said set such that, for each of said respective (N−1) combining means, corresponding information samples of the respective streams of information component samples at the first input and at the second input of the adder thereof occur substantially in time coincidence with one another,
whereby said synthesized single temporal signal is obtained at the adder output of said combining means associated with said first separate signal of said set.

35. The apparatus defined in claim 34, wherein:

said second means of the respective combining means individually associated with each one of said first to (N−2)th ordinal ones of said set of separate signals includes a sample expander, responsive to a lower sample density stream of information component samples at said adder output being forwarded, for inserting additional samples in said forwarded stream to raise the sample density at the second input of the adder of that one combining means to the sample density of the ordinal separate signal associated with that one combining means, each of said inserted additional samples having a zero-value level, and an interpolation means that is effective in substituting an interpolated-value sample level for the zero-value level of each of said inserted additional samples.

36. The apparatus defined in claim 35, wherein:

said Nth separate signal of said set has a sample density lower than said (N-1)th separate signal of said set; and said third means includes a sample expander and interpolation means, like those of said second means, for forwarding said Nth separate signal to the second input of the adder of said third means.

37. The apparatus defined in claim 35, wherein:

said Nth separate signal of said set has substantially the same sample density as said (N-1)th separate signal of said set; and said third means directly forwards said Nth separate signal to the second input of the adder of said third means.

38. The apparatus defined in claim 35, wherein:

said stream of information component samples corresponding to each of at least the second to (N−1)th of said ordinally arranged set of N separate signals has a sample density for each of its own information dimensions which is one-half the sample density of the corresponding information dimension of the stream of information component samples corresponding to its immediately preceding separate signal of said set;

said expander of a second means inserts an additional sample in between each pair of successive samples of said lower sample density in each dimension of the stream of information component samples at said adder output being forwarded; and said information means is comprised of an n-tap interpolation filter (where n is a plural given integer) having a low-pass transfer function.

39. The apparatus defined in claim 34, wherein:

said third means and each of said respective second means of said group of N-1 sampled-signal combining means inserts its own predetermined amount of time delay in forwarding its stream of information component samples as a second input to its adder; and each of said first means of said group of N−1 sampled-signal combining means includes delay means that inserts a particular amount of time delay in forwarding its ordinal separate signal as a first input to its adder which is dependent on both (1) the respective time skew between its ordinal separate signal and each of those separate signals of said set that follow its ordinal separate signal and (2) the total amount of time delay inserted by said third means and all second means of those combining means associated with the separate signals of said set that follow its ordinal separate signal, said particular amount of delay being such that corresponding information samples of the respective streams of information component samples at the first input and at the second input of its adder occur substantially in time coincidence with one another.

* * * * *